US012597760B2

(12) United States Patent (10) Patent No.: US 12,597,760 B2
Imai et al. (45) Date of Patent: Apr. 7, 2026

(54) LIGHT-EMITTING DEVICE

(71) Applicant: NICHIA CORPORATION, Anan (JP)

(72) Inventors: Takeshi Imai, Anan (JP); Koji Yuasa, Anan (JP)

(73) Assignee: NICHIA CORPORATION, Anan (JP)

( * ) Notice: Subject to any disclaimer, the term of this patent is extended or adjusted under 35 U.S.C. 154(b) by 634 days.

(21) Appl. No.: 18/145,011

(22) Filed: Dec. 21, 2022

(65) Prior Publication Data

US 2023/0208111 A1     Jun. 29, 2023

(30) Foreign Application Priority Data

Dec. 24, 2021     (JP) ................................. 2021-210992
Nov. 8, 2022     (JP) ................................. 2022-178683

(51) Int. Cl.
| | |
|---|---|
| *H01S 5/40* | (2006.01) |
| *H01S 5/323* | (2006.01) |
| *H01S 5/02253* | (2021.01) |
| *H01S 5/02345* | (2021.01) |

(52) U.S. Cl.
CPC ........ *H01S 5/4087* (2013.01); *H01S 5/32308* (2013.01); *H01S 5/02253* (2021.01); *H01S 5/02345* (2021.01)

(58) Field of Classification Search
CPC ................................. H01S 5/4087; H01S 5/42
See application file for complete search history.

(56) References Cited

U.S. PATENT DOCUMENTS

| | | | |
|---|---|---|---|
| 2013/0121354 A1* | 5/2013 | Takaki ..................... | G02B 6/42 |
| | | | 372/50.12 |
| 2014/0269796 A1* | 9/2014 | Geske ................... | H01S 5/4087 |
| | | | 372/34 |
| 2014/0354367 A1* | 12/2014 | Suzuki ................... | G04F 5/145 |
| | | | 331/94.1 |
| 2015/0263246 A1 | 9/2015 | Hiramatsu et al. | |
| 2016/0062224 A1 | 3/2016 | Nagahara et al. | |
| 2016/0077418 A1 | 3/2016 | Yamamoto | |
| 2019/0094673 A1 | 3/2019 | Tian et al. | |

(Continued)

FOREIGN PATENT DOCUMENTS

| | | |
|---|---|---|
| JP | 2004-157225 A | 6/2004 |
| JP | 2015-132665 A | 7/2015 |

(Continued)

*Primary Examiner* — James A Menefee
(74) *Attorney, Agent, or Firm* — Spencer Fane LLP

(57) ABSTRACT

A light-emitting device includes semiconductor laser elements including first color-light-emitting laser elements that emit red light, arrayed in a matrix of M rows and N columns (where M≥2 and N≥3). The first color-light-emitting laser elements include two or more first semiconductor laser elements each having an emission peak wavelength of smaller than 647 nm±2 nm, two or more second semiconductor laser elements each having an emission peak wavelength of smaller than 643 nm±2 nm, and two or more third semiconductor laser elements each having an emission peak wavelength of smaller than 639 nm±2 nm. In the M rows and the N columns, in whole or in part, a semiconductor laser element other than the two or more first semiconductor laser elements is adjacent to any one of the two or more first semiconductor laser elements.

15 Claims, 23 Drawing Sheets

(56) References Cited

U.S. PATENT DOCUMENTS

| | | | | |
|---|---|---|---|---|
| 2020/0358256 A1* | 11/2020 | Engelen | ............. | H01S 5/18344 |
| 2021/0218229 A1* | 7/2021 | Fuchs | ................ | H01S 5/02257 |

FOREIGN PATENT DOCUMENTS

| | | |
|---|---|---|
| JP | 2015-176949 A | 10/2015 |
| JP | 2015-176968 A | 10/2015 |
| JP | 2016-051603 A | 4/2016 |
| JP | 2016-061882 A | 4/2016 |
| JP | 2021-057512 A | 4/2021 |

* cited by examiner

LIGHT-EMITTING DEVICE

CROSS-REFERENCE TO RELATED APPLICATION

This application claims priority to Japanese Patent Application No. 2021-210992 filed on Dec. 24, 2021, and Japanese Patent Application No. 2022-178683 filed on Nov. 8, 2022, the disclosures of which are hereby incorporated by reference in their entireties.

BACKGROUND

The present disclosure relates to a light-emitting device.

Japanese Patent Publication No. 2021-57512 discloses a semiconductor laser light source device including a plurality of first elements and a plurality of second elements for the purpose of achieving high output with reduced speckle noise. The first elements and second elements are arrayed so that elements with better temperature characteristics are placed in a center and elements with worse temperature characteristics are placed therearound.

SUMMARY

However, in Japanese Patent Publication No. 2021-57512, the semiconductor laser elements are configured to emit light at multiple wavelengths as a means for reducing speckle noise, and the semiconductor laser elements are arrayed on the basis of temperature characteristics as a means for achieving higher output. That is, no consideration has been given to reducing speckle noise by the array, and there is still room for improvement in reducing speckle noise.

A light-emitting device according to an aspect of the present disclosure includes a plurality of semiconductor laser elements including a plurality of first color-light-emitting laser elements that emit red light, and arrayed in a matrix of M rows and N columns (where M is a natural number and M≥2, and N is a natural number and N≥3). The first color-light-emitting laser elements include two or more first semiconductor laser elements each having an emission peak wavelength of smaller than 647 nm±2 nm, two or more second semiconductor laser elements each having an emission peak wavelength of smaller than 643 nm±2 nm, and two or more third semiconductor laser elements each having an emission peak wavelength of smaller than 639 nm±2 nm. In the M rows and the N columns, in whole or in part, the plurality of semiconductor laser elements are disposed so that, in a row direction, a semiconductor laser element other than any one of the two or more first semiconductor laser elements is adjacent to each of the two or more first semiconductor laser elements, a semiconductor laser element other than any one of the two or more second semiconductor laser elements is adjacent to each of the two or more second semiconductor laser elements, and a semiconductor laser element other than any one of the two or more third semiconductor laser elements is adjacent to each of the two or more third semiconductor laser elements, and in the row direction, each of the two or more first semiconductor laser elements is not adjacent to any one of the two or more first semiconductor laser elements, each of the two or more second semiconductor laser elements is not adjacent to any one of the second semiconductor laser element, and each of the two or more third semiconductor laser elements is not adjacent to any one of the two or more third semiconductor laser elements.

A light-emitting device according to an aspect of the present disclosure includes a plurality of semiconductor laser elements including a plurality of first color-light-emitting laser elements that emit green light, and arrayed in a matrix of M rows and N columns (where M is a natural number and M≥2, and N is a natural number and N≥3). The first color-light-emitting laser elements include two or more first semiconductor laser elements each having an emission peak wavelength in a range of greater than 527 nm and smaller than 532 nm, two or more second semiconductor laser elements each having an emission peak wavelength in a range of greater than 523 nm and smaller than 527 nm, and two or more third semiconductor laser elements each having an emission peak wavelength in a range of greater than 518 nm and smaller than 523 nm. In the M rows and the N columns, in whole or in part, the plurality of first color-light-emitting laser elements are disposed so that, in a row direction, a semiconductor laser element other than the two or more first semiconductor laser elements is adjacent to any one of the two or more first semiconductor laser elements, a semiconductor laser element other than the two or more second semiconductor laser elements is adjacent to any one of the two or more second semiconductor laser elements, and a semiconductor laser element other than the two or more third semiconductor laser elements is adjacent to any one of the two or more third semiconductor laser elements, and in the row direction, any one of the two or more first semiconductor laser elements is not adjacent to any one of the two or more first semiconductor laser elements, any one of the two or more second semiconductor laser elements is not adjacent to any one of the two or more second semiconductor laser element, and any one of the two or more third semiconductor laser elements is not adjacent to any one of the two or more third semiconductor laser elements.

A light-emitting device according to an aspect of the present disclosure includes a plurality of semiconductor laser elements including a plurality of first color-light-emitting laser elements that emit green light, and arrayed in a matrix of M rows and N columns (where M is a natural number and M≥2, and N is a natural number and N≥3). The first color-light-emitting laser element includes two or more first semiconductor laser elements each having an emission peak wavelength in a range of greater than 534 nm and smaller than 539 nm, two or more second semiconductor laser elements each having an emission peak wavelength in a range of greater than 530 nm and smaller than 534 nm, and two or more third semiconductor laser elements each having an emission peak wavelength in a range of greater than 525 nm and smaller than 530 nm. In the M rows and the N columns, in whole or in part, the plurality of first color-light-emitting laser element are disposed so that in a row direction, a semiconductor laser element other than the two or more first semiconductor laser elements is adjacent to any one of the two or more first semiconductor laser elements, a semiconductor laser element other than the two or more second semiconductor laser elements is adjacent to any one of the two or more second semiconductor laser elements, and a semiconductor laser element other than the two or more third semiconductor laser elements is adjacent to any one of the two or more third semiconductor laser elements, and in the row direction, any one of the two or more first semiconductor laser elements is not adjacent to any one of the two or more first semiconductor laser elements, any one of the two or more second semiconductor laser elements is not adjacent to any one of the two or more second semiconductor laser element, and any one of the two or more third semiconductor laser elements is not adjacent to any one of the two or more third semiconductor laser elements.

In at least one or more aspects according to the present disclosure disclosed in an embodiment, a light-emitting device with reduced speckle noise can be provided.

DETAILED DESCRIPTION

Figure 1:
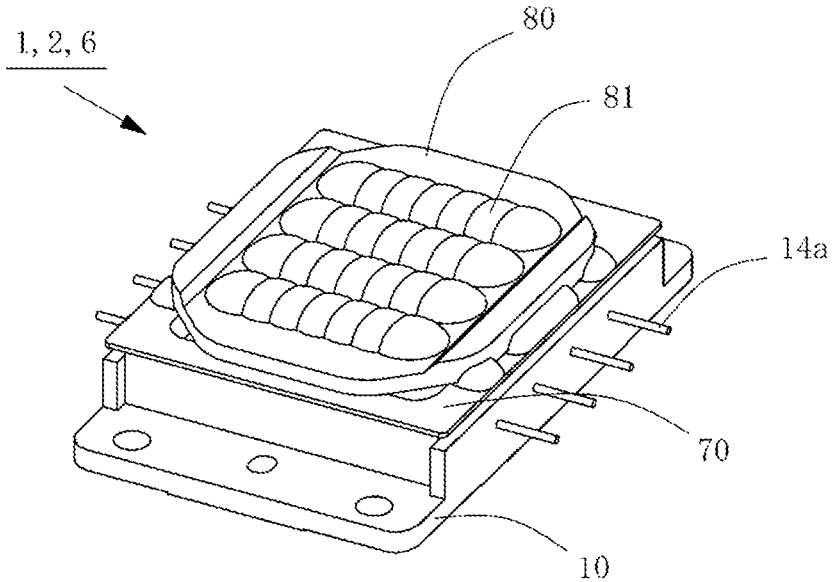
FIG. 1 is a schematic perspective view of a light-emitting device according to a first embodiment, a second embodiment, and a sixth embodiment.

In this specification or the scope of the claims, polygons such as triangles and quadrangles, including shapes in which the corners of the polygon are rounded, chamfered, beveled, coved, or the like, are referred to as polygons. Furthermore, a shape obtained by processing not only the corners (ends of sides), but also an intermediate portion of a side is similarly referred to as a polygon. That is, a shape that is partially processed while remaining a polygon shape as a base is included in the interpretation of "polygon" described in this specification and the scope of the claims.

The same applies not only to polygons but also to words representing specific shapes such as trapezoids, circles, protrusions, and recessions. Furthermore, the same applies to dealing with each side forming that shape. That is, even if processing is performed on a corner or an intermediate portion of a certain side, the interpretation of "side" includes the processed portion. Note that when a "polygon" or "side" not partially processed is to be distinguished from a processed shape, "strict" will be added to the description as in, for example, "quadrangle in a strict sense".

Furthermore, in this specification or the scope of the claims, expressions such as upper and lower, left and right, top and bottom, front and back, near and far, and the like are used merely to describe a relative relationship of positions, orientations, directions, and the like, and the expressions need not necessarily match an actual relationship at a time of use.

In the drawings, directions such as an X direction, a Y direction, and a Z direction may be indicated by using arrows. Directions of the arrows match between the plurality of drawings according to the same embodiment.

The terms "member" or "portion" may be used to describe a component or the like in this specification. The term "member" refers to an object physically treated alone. The object physically treated alone can be an object treated as one part in a manufacturing step. On the other hand, the term "portion" refers to an object that may not be physically treated alone. For example, the term "portion" is used when a part of one member is partially regarded.

Note that a distinction in writing between "member" and "portion" described above does not indicate the intention of consciously limiting the scope of rights in the interpretation of the scope of rights including doctrine of equivalents. In other words, even when there is a component described as "member" in the scope of the claims, it does not mean that the applicant recognizes that physically treating the component alone is essential for the application of the present disclosure.

Furthermore, in this specification or the scope of the claims, when there are a plurality of components and each of the components is to be expressed separately, the components may be distinguished by adding the terms of ordinal numbers, such as "first" and "second" at the beginning the component term. Further, objects to be distinguished may differ between this specification and the scope of the claims. Thus, even when a component provided with the same term as that in this specification is described in the scope of the claims, an object identified by the component may not be the same in this specification and the scope of the claims.

For example, when there are components distinguished by being termed as ordinal numbers such as "first", "second", and "third" in this specification, and when the components provided with the terms "first" and "third" in this specification are described in the scope of the claims, the components may be distinguished by being termed "first" and "second" in the scope of the claims from a perspective of ease of understanding. In this case, the components termed "first" and "second" in the scope of the claims refer to the components termed "first" and "third" in this specification, respectively. Note that an object applied for this rule is not limited to a component, and the rule also applies to another object in a reasonable and flexible manner.

Further, in the present specification, in certain embodiments (including examples and variations), a component may be described in terms of a singular component even if applicable as both singularity and a plurality. Whether or not the contents described for a singular component are also applicable to a plurality of the components is on the basis of the drawings related to the embodiment. That is, in a case in which the contents are inconsistent with the drawings when applied to a plurality of the components, it can be said that the contents are not applicable to a plurality of the components, and conversely, in a case in which the contents are not inconsistent with the drawings when applied to a plurality of the components, the contents are selectively applicable to the description of the components, both singularly and in a plurality. The reason for use of the singular form to describe the same content applicable to both a singularity and a plurality is to avoid redundancy in explanation by repetition of content that is the same other than being a singularity or a plurality, and for reader convenience. Therefore, the content described in singular form includes a description of the content with the singular form replaced by the plural form and also includes a description of the content with the singular form replaced by the expression "each of the plurality," as long as there is no inconsistency in the drawings.

Embodiments for implementing the present disclosure will be described below. Furthermore, specific embodiments for implementing the present disclosure will be described below with reference to the drawings. Note that embodiments for implementing the present disclosure are not limited to the specific embodiments. In other words, the embodiments shown in the figures are not an only form in which the present disclosure is realized. Note that sizes, positional relationships, and the like of members illustrated in the drawings may sometimes be exaggerated in order to facilitate understanding.

First Embodiment

Figure 2:
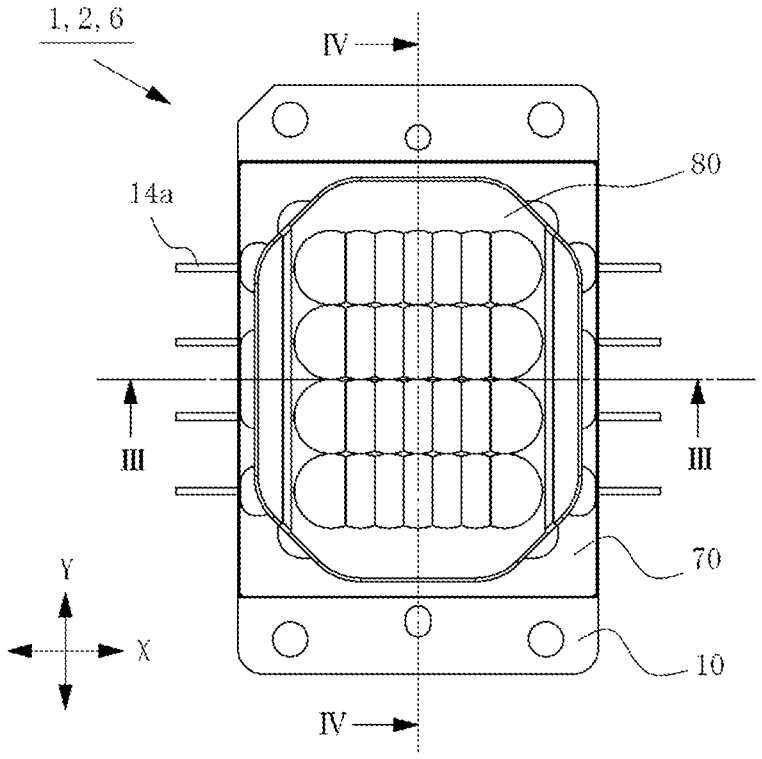
FIG. 2 is a schematic top view corresponding to FIG. 1.
Figure 3:
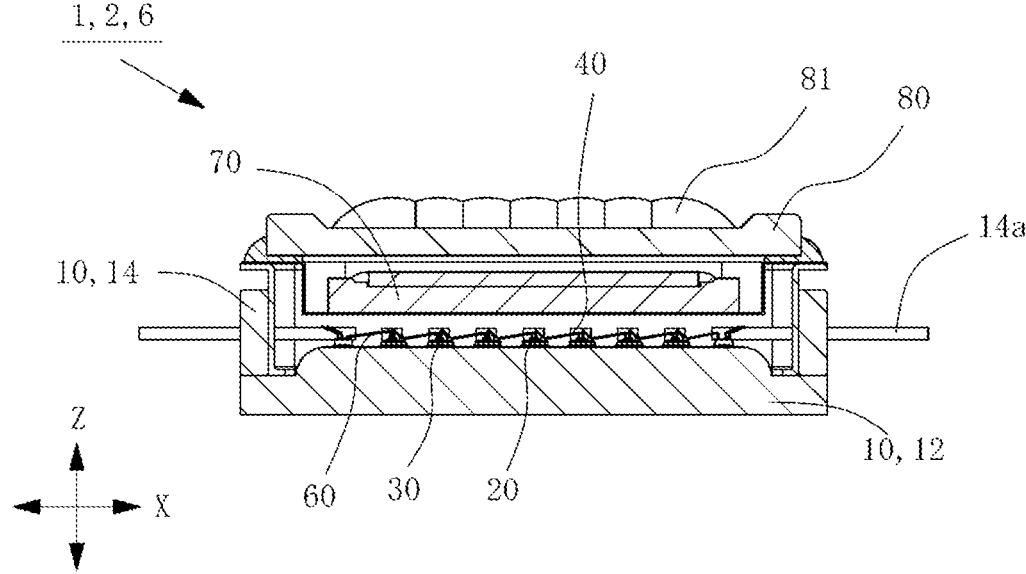
FIG. 3 is a schematic cross-sectional view of the light-emitting device taken along line in FIG. 2.
Figure 4:
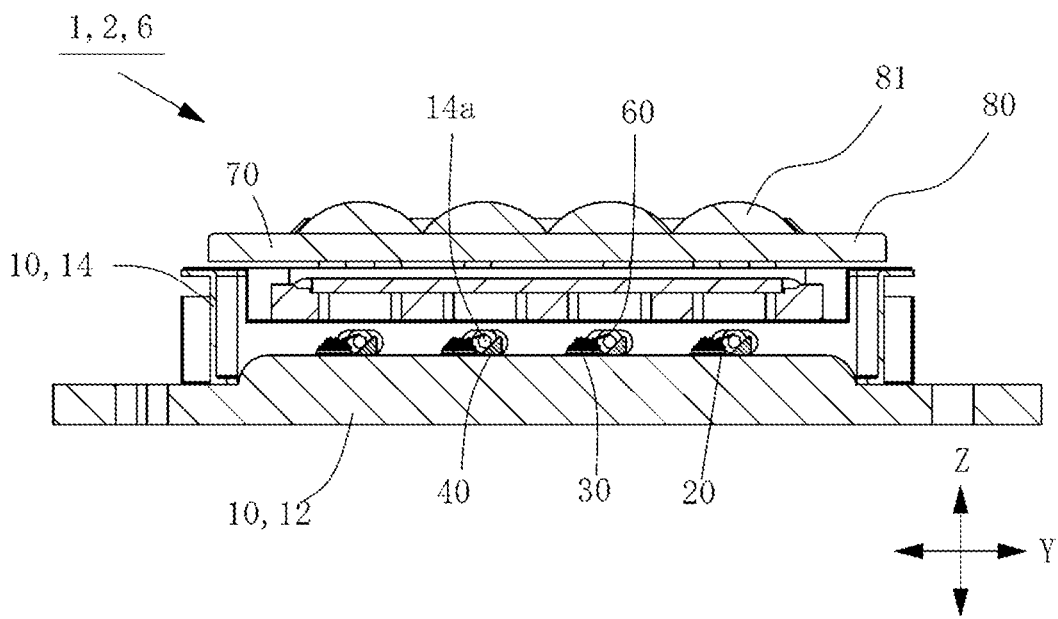
FIG. 4 is a schematic cross-sectional view of the light-emitting device taken along line IV-IV in FIG. 2.
Figure 5:
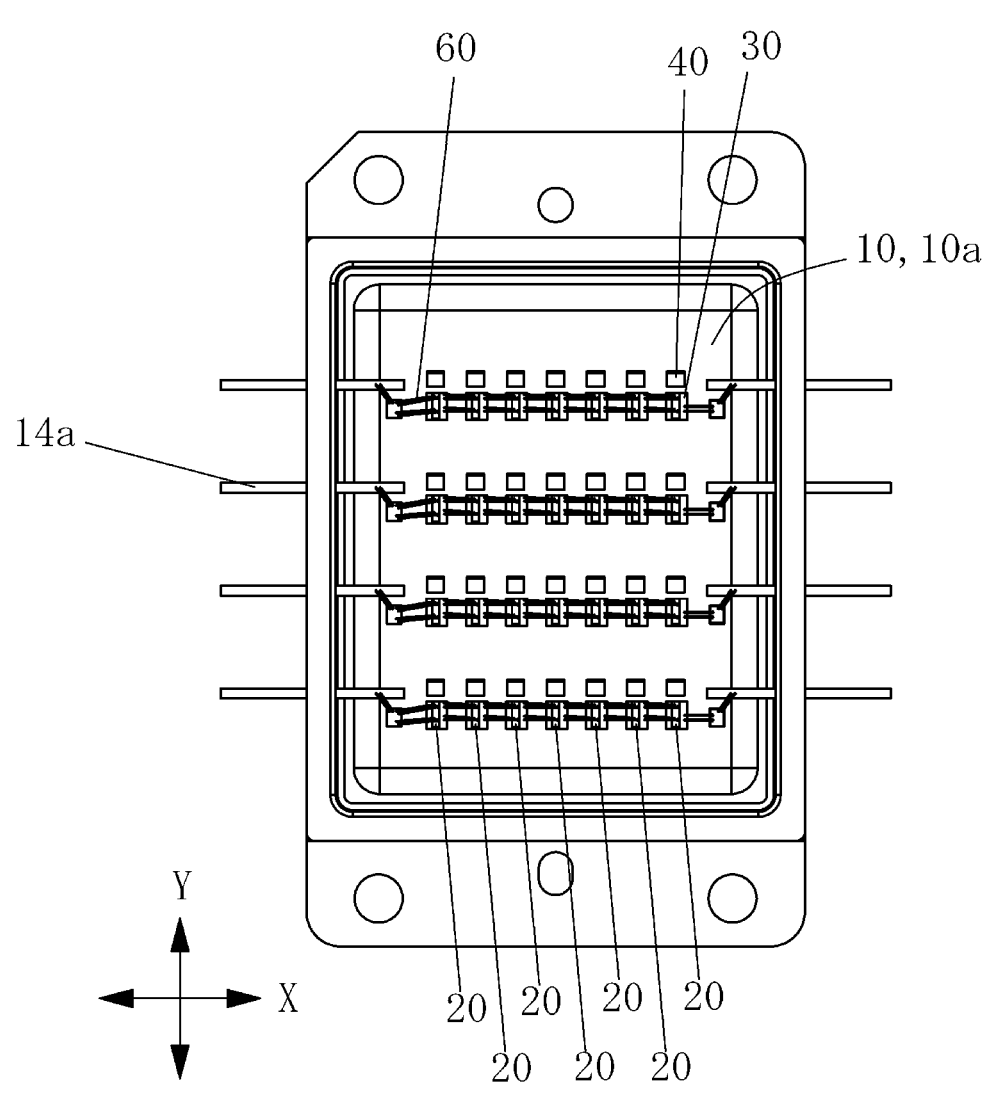
FIG. 5 is a schematic top view for explaining an array of semiconductor laser elements disposed in a package in the light-emitting device according to the first embodiment.

A light-emitting device 1 according to a first embodiment will now be described. FIGS. 1 to 9 are drawings for explaining an exemplary form of the light-emitting device 1. FIG. 1 is a schematic perspective view of the light-emitting device 1. FIG. 2 is a schematic top view of the light-emitting device 1. FIG. 3 is a schematic cross-sectional view of the light-emitting device 1 taken along line in FIG. 2. FIG. 4 is a schematic cross-sectional view of the light-emitting device 1 taken along line IV-IV in FIG. 2. FIG. 5 is a schematic top view for explaining an array of semiconductor laser elements 20 disposed in a package, with some components removed from the light-emitting device 1. FIGS. 6 to 9 are each a drawing illustrating an example of an array of light emitted from the light-emitting device 1.

The light-emitting device 1 includes a plurality of components including a base 10, a plurality of the semiconductor laser elements 20, a plurality of submounts 30, one or more light-reflecting members 40, a plurality of wirings 60, a sealing member 70, and a lens member 80.

The light-emitting device 1 may further include other components. For example, the light-emitting device 1 may further include a light-emitting element such as a semiconductor laser element or a light-emitting diode different from the plurality of semiconductor laser elements 20. The light-emitting device 1 may not include some of the plurality of components described above.

First, each of the components will be described.

Base 10

The base 10 includes a base portion 12 and a lateral wall portion 14 projecting upwardly from the base portion 12. The base portion 12 and the lateral wall portion 14 form a concave shape in which the inside of the lateral wall portion 14 is recessed. In other words, the base 10 includes a recessed portion 10a defining a recessed shape.

The base portion 12 includes a protruding portion. The protruding portion is surrounded by the lateral wall portion 14. The protrusion of the protrusion portion is accommodated in the recessed portion 10a. An uppermost surface of the protruding portion is positioned below an uppermost surface of the recessed portion 10a. The uppermost surface of the protruding portion is a mounting surface on which other components are mounted. The base portion 12 has a shape including the protruding portion, making it possible to suppress warping of the mounting surface even in a case in which the base portion 12 and the lateral wall portion 14 are formed of materials different from each other. The shape of the base 10 is not limited thereto, and may be, for example, a flat plate shape.

The base 10 includes a plurality of wiring portions 14a. The wiring portion 14a includes an inner wiring region provided inside the recessed portion 10a and an outer wiring region provided outside the recessed portion 10a. The inner wiring region and the outer wiring region in the wiring portion 14a are conductive. The inner wiring region is joined to a component disposed in the recessed portion 10a.

The wiring portion 14a is provided on the lateral wall portion 14. For example, the wiring portion 14a can be provided by a lead pin passing through the lateral wall portion 14. The base 10 can include one or more wiring portions 14a on each of wall surfaces of the lateral wall portion 14 facing each other.

The base 10 can be formed of a metal material such as, for example, iron, an iron alloy, or copper. The base 10 can be formed of a ceramic material such as MN, SiC, or SiN. In the base 10, the base portion 12 and the lateral wall portion 14 can be formed of materials different from each other, and then joining these. The base 10 can include a base member constituting the base portion 12 and a wall member constituting the lateral wall portion 14. A lead pin of metal can be adopted for the wiring portion 14*a*.

Semiconductor Laser Element 20

The semiconductor laser element 20 includes a light-exiting surface that emits light. The semiconductor laser element 20 includes an upper surface, a lower surface, and a plurality of lateral surfaces. The upper surface or a lateral surface of the semiconductor laser element 20 serves as the light-exiting surface. A shape of the upper surface of the semiconductor laser element 20 is a rectangular shape having long sides and short sides. The shape of the upper surface of the semiconductor laser element 20 need not be rectangular.

The semiconductor laser element 20 is a single-emitter semiconductor laser element. The semiconductor laser element 20 may be a multi-emitter semiconductor laser element including a plurality of emitters. When a multi-emitter semiconductor laser element is adopted as the semiconductor laser element 20, the number of emitters is preferably two. Given the fact that when the number of emitters increases, the semiconductor laser element 20 may also become larger, and given an effect of heat dissipation and the like, a semiconductor laser element having an appropriate number of emitters only has to be adopted.

As the semiconductor laser element 20, for example, a semiconductor laser element that emits red light or a semiconductor laser element that emits green light can be adopted. Further, a semiconductor laser element that emits blue light can be adopted as the semiconductor laser element 20. Alternatively, a semiconductor laser element that emits light of another color can be adopted as the semiconductor laser element 20.

Blue light refers to light having an emission peak wavelength within a range from 420 nm to 494 nm. Green light refers to light having the emission peak wavelength within a range from 495 nm to 570 nm. Red light refers to light having the emission peak wavelength within a range from 605 nm to 750 nm.

The semiconductor laser element 20 has a rectangular outer shape having one set of opposite sides as long sides and another set of opposite sides as short sides in a top view. Light (laser light) emitted from the semiconductor laser element 20 spreads. Further, divergent light is emitted from an exiting end surface (light-exiting surface) of the semiconductor laser element 20.

The light emitted from the semiconductor laser element 20 forms a far field pattern (hereinafter referred to as an "FFP") of an elliptical shape in a plane parallel to the exiting end surface of the light. The FFP indicates a shape and a light intensity distribution of the emitted light at a position separated from the exiting end surface.

Here, light passing through the center of the elliptical shape of the FFP, in other words, light having a peak intensity in the light intensity distribution of the FFP, is referred to as light traveling on an optical axis or light passing through an optical axis. Based on the light intensity distribution of the FFP, light having an intensity of $1/e^2$ or greater with respect to a peak intensity value is referred to as a main portion of the light.

The shape of the FFP of the light emitted from the semiconductor laser element 20 is an elliptical shape in which the light in a layering direction is longer than in a direction perpendicular to the layering direction in the plane parallel to the exiting end surface of the light. The layering direction is a direction in which a plurality of semiconductor layers including an active layer are layered in the semiconductor laser element 20. The direction perpendicular to the layering direction can also be referred to as a plane direction of the semiconductor layer. Further, a long diameter direction of the elliptical shape of the FFP can also be referred to as a fast axis direction of the semiconductor laser element 20, and a short diameter direction of the elliptical shape of the FFP can also be referred to as a slow axis direction of the semiconductor laser element 20.

Based on the light intensity distribution of the FFP, an angle at which light having a light intensity of $1/e^2$ of a peak light intensity spreads is referred to as a spread angle of light of the semiconductor laser element 20. For example, a spread angle of light may also be determined based on the light intensity that is half of the peak light intensity in addition to being determined based on the light intensity of $1/e^2$ of the peak light intensity. In the description in this specification, a "spread angle of light" being simply referred refers to a spread angle of light at the light intensity of $1/e^2$ of the peak light intensity. Note that it can be said that a spread angle in the fast axis direction is greater than a spread angle in the slow axis direction.

The semiconductor laser element 20 can be a semiconductor laser element including an active layer formed of a GaAs-based material. The semiconductor laser element 20 can be a semiconductor laser element including an active layer formed of a GaN-based material.

Examples of the semiconductor laser element 20 that emits blue light or the semiconductor laser element 20 that emits green light include a semiconductor laser element including an active layer formed of a GaN-based material. Examples of the GaN-based material include GaN, InGaN, and AlGaN. Examples of the semiconductor laser element 20 that emits red light include a semiconductor laser element including an active layer constituted by a semiconductor formed of a GaP-based or GaAs-based material. Examples of the GaAs-based material include GaAs and AlGaAs. Examples of the GaP-based material include GaP, AlGaP, and AlGaInP. The active layer may be constituted by a semiconductor including As and P such as GaAsP.

Submount 30

The submount 30 includes a lower surface, an upper surface, and one or more lateral surfaces. The submount 30 has the smallest width in a vertical direction. The submount 30 is formed in a rectangular parallelepiped shape. The shape may not be limited to a rectangular parallelepiped. The submount 30 may be formed using, for example, silicon nitride, aluminum nitride, or silicon carbide. A semiconductor laser element may be mounted on or the wiring 60 may be connected to the submount 30, or both.

Light-Reflecting Member 40

The light-reflecting member 40 includes a light-reflecting surface. The light-reflecting surface has, for example, a reflectance of 90% or greater with respect to the peak wavelength of the irradiated light. The light reflectance may be 100% or less, or may be less than 100%.

For the light-reflecting member 40, glass, metal, or the like can be used as a main material that forms an outer shape thereof. As the main material, a heat-resistant material is preferable, and for example, glass such as quartz or BK7 (borosilicate glass), or a metal such as aluminum can be employed. Alternatively, Si may also be used as the main material. The light-reflecting surface can be formed using, for example, a metal such as Ag or Al, or a dielectric multilayer film of $Ta_2O_5/SiO_2$, $TiO_2/SiO_2$, $Nb_2O_5/SiO_2$ or the like.

Here, the main material refers to a material that occupies the greatest ratio of a formed body being an object in terms of weight or volume. Note that, when a formed body being an object is formed of one material, the material is the main material. In other words, when a certain material is the main material, a ratio of the material may be 100%.

Wiring 60

The wiring 60 is formed of a conductor having a linear shape with joint portions at both ends. In other words, the wiring 60 includes joint portions joined to other components, at both ends of the linear portion. The wiring 60 is used for electrical connection between two components. For example, a metal wire can be used as the wiring 60. Examples of the metal include gold, aluminum, silver, copper, or the like.

Sealing Member 70

The sealing member 70 includes an upper surface and a lower surface. At least a portion of the sealing member 70 has transmissivity from the upper surface to the lower surface. Note that having transmissivity refers to a property by which the transmittance of primary light incident thereon is 80% or higher.

The sealing member 70 is partially transmissive. For example, the sealing member 70 includes a frame body not having transmissivity provided with one or more openings, and one or more transmissive members having transmissivity and covering the one or more openings of the frame body. The sealing member 70 may have transmissivity across its entirety.

A transmissive material such as, for example, glass, sapphire, or quartz may be used for the main material of the sealing member 70. Further, for example, a metal can be used as the main material of the frame body, and the transmissive material described above can be used as the transmissive material.

Lens Member 80

The lens member 80 includes an upper surface and a lower surface. The lens member 80 includes a plurality of lens surfaces. The plurality of lens surfaces are formed on the upper surface side of the lens member 80. The upper surface of the lens member 80 can be configured to include a plurality of lens surfaces. In the lens member 80, a portion that forms each lens surface is referred to as a lens portion 81.

The lens member 80 may have a plurality of lens surfaces arrayed in a matrix of M row and N columns (where M is natural number and M≥2, and N is a natural number and N≥3). The plurality of lens surfaces include at least three or more lens surfaces disposed side by side. The lens member 80 can be formed by using a material having transmissivity such as glass or synthetic quartz.

Next, the light-emitting device 1 will be described.

Light-Emitting Device 1

In the light-emitting device 1, the plurality of semiconductor laser elements 20 are arrayed in a matrix of M row and N columns (where M is natural number and M≥2, and N is a natural number and N≥3). The semiconductor laser element 20 is disposed on the mounting surface of the base 10. The semiconductor laser element 20 is mounted on the submount 30. The plurality of semiconductor laser elements 20 are each mounted on a different submount 30. The plurality of semiconductor laser elements 20 are disposed inside the recessed portion 10a.

The plurality of semiconductor laser elements 20 are disposed with the light-exiting surfaces thereof in the same orientation. Polarization directions of the light emitted from the plurality of semiconductor laser elements 20 are aligned. Alternatively, the polarization directions of the light emitted from the plurality of semiconductor laser elements 20 are not aligned. The polarization directions of the emitted light may be aligned for N semiconductor laser elements 20 arranged in the same row, and the polarization directions of the emitted light may be made different between these semiconductor laser elements 20 and the semiconductor laser elements 20 disposed in a different row.

The light-emitting device 1 includes two or more semiconductor laser elements 20 disposed side by side in a first direction in a top view. The first direction is the same direction as the row direction of the plurality of semiconductor laser elements 20 disposed in a matrix. The two or more semiconductor laser elements 20 side by side in the first direction are disposed at equal intervals.

The light-emitting device 1 includes two or more semiconductor laser elements 20 disposed side by side in a second direction perpendicular to the first direction in a top view. The second direction is the same direction as the column direction of the plurality of semiconductor laser elements 20 disposed in a matrix. The two or more semiconductor laser elements 20 side by side in the second direction are disposed at equal intervals.

The X direction illustrated in the drawings may be the row direction of the plurality of semiconductor laser elements 20 disposed in a matrix. Alternatively, the Y direction illustrated in the drawings may be the row direction of the plurality of semiconductor laser elements 20 disposed in a matrix. Whether the X direction is the row direction or the Y direction is the row direction may be selected as appropriate. In the light-emitting device 1 shown in the figure, 28 semiconductor laser elements 20 are disposed in a 4×7 or a 7×4 matrix.

The light-exiting surfaces of the two or more semiconductor laser elements 20 side by side in the first direction are provided in the same virtual plane. The light-exiting surfaces of the two or more semiconductor laser elements 20 side by side in the second direction are disposed in positions where a virtual line parallel to the second direction passes therethrough. Optical axes of the light emitted from the light-exiting surfaces of the plurality of semiconductor laser elements 20 are parallel to the second direction.

Each of the plurality of semiconductor laser elements 20 can be a semiconductor laser element including an active layer formed of a GaAs-based material. Each of the plurality of semiconductor laser elements 20 can be a semiconductor laser element including an active layer formed of a GaP-based material. Alternatively, each of the semiconductor laser elements 20 can be a semiconductor laser element including an active layer formed of a GaN-based material.

All of the plurality of light-emitting elements 20 emit light of the same color. For example, each of the plurality of semiconductor laser elements 20 is a semiconductor laser element that emits red light. For example, each of the plurality of semiconductor laser elements 20 is a semiconductor laser element that emits green light. For example, each of the plurality of semiconductor laser elements 20 is a semiconductor laser element that emits blue light.

The plurality of semiconductor laser elements 20 include two or more first semiconductor laser elements 20A having an emission peak wavelength of a first wavelength, two or more second semiconductor laser elements 20B having an emission peak wavelength of a second wavelength, and two or more third semiconductor laser elements 20C having an emission peak wavelength of a third wavelength. The second wavelength is a wavelength shorter than the first wavelength. The third wavelength is a wavelength shorter than the second wavelength. The emission peak wavelength of the semiconductor laser element 20 refers to a peak wavelength of the laser light emitted by the semiconductor laser element 20 in the light-emitting device 1.

For example, the plurality of semiconductor laser elements 20 that emit red light may be adopted, with the first semiconductor laser element 20A having an emission peak wavelength of 647 nm±2 nm (645 nm<emission peak wavelength<649 nm), the second semiconductor laser element 20B having an emission peak wavelength of 643 nm±2 nm (641 nm<emission peak wavelength<645 nm), and the third semiconductor laser element 20C having an emission peak wavelength of 639 nm±2 nm (637 nm<emission peak wavelength<641 nm). Here, ±2 nm indicates a wavelength range guaranteed as an emission peak wavelength in consideration of manufacturing variance and the like. Therefore, a wavelength range of the emission peak wavelength may be guaranteed at a value smaller or a value larger than ±2 nm. However, this wavelength range of the first semiconductor laser element 20A and this wavelength range of the second semiconductor laser element 20B should not overlap. This is because, when there are overlapping wavelengths, there may be a case in which there is no difference in the emission peak wavelengths between the first semiconductor laser element 20A and the second semiconductor laser element 20B. The same holds true for the second semiconductor laser element 20B and the third semiconductor laser element 20C. In the case of this example, whether the semiconductor laser element 20 having the emission peak wavelength of 645 nm is referred to as the first semiconductor laser element 20A or the second semiconductor laser element 20B may be determined as desired. Similarly, whether the semiconductor laser element 20 having the emission peak wavelength of 641 nm is referred to as the second semiconductor laser element 20B or the third semiconductor laser element 20C may be determined as desired.

Further, for example, the plurality of semiconductor laser elements 20 that emit green light may be adopted, with the first semiconductor laser element 20A being an element in which 527 nm<emission peak wavelength<532 nm, the second semiconductor laser element 20B being an element in which 523 nm<emission peak wavelength<527 nm, and the third semiconductor laser element 20C being an element in which 518 nm<emission peak wavelength<523 nm. In the case of this example, whether the semiconductor laser element 20 having the emission peak wavelength of 527 nm is referred to as the first semiconductor laser element 20A or the second semiconductor laser element 20B may be determined as desired. Similarly, whether the semiconductor laser element 20 having the emission peak wavelength of 523 nm is referred to as the second semiconductor laser element 20B or the third semiconductor laser element 20C may be determined as desired.

Further, for example, the plurality of semiconductor laser elements 20 that emit green light may be adopted, with the first semiconductor laser element 20A being an element in which 534 nm<emission peak wavelength<539 nm, the second semiconductor laser element 20B being an element in which 530 nm<emission peak wavelength<534 nm, and the third semiconductor laser element 20C being an element in which 525 nm<emission peak wavelength<530 nm. In the case of this example, whether the semiconductor laser element 20 having the emission peak wavelength of 534 nm is referred to as the first semiconductor laser element 20A or the second semiconductor laser element 20B may be determined as desired. Similarly, whether the semiconductor laser element 20 having the emission peak wavelength of 530 nm is referred to as the second semiconductor laser element 20B or the third semiconductor laser element 20C may be determined as desired.

Regarding the above two examples of semiconductor laser elements emitting green light, the former example can have a higher light output than that of the latter example. On the other hand, when used in an image display or the like, the latter example can have a wider color gamut than that of the former example.

The plurality of semiconductor laser elements 20 may further include a semiconductor laser element 20 having an emission peak wavelength different from these. The plurality of semiconductor laser elements 20 include the semiconductor laser elements 20 from the first semiconductor laser element 20 to the R-th semiconductor laser element 20 (where R is a natural number and R≥3) so that the number of semiconductor laser elements 20 per type is two or more. The first semiconductor laser element 20 to the R-th semiconductor laser element 20 are R types of semiconductor laser elements 20 in which a semiconductor laser element 20 with a larger ordinal number has a shorter emission peak wavelength.

In the plurality of semiconductor laser elements 20, the quantities are the same between any couple selected from the group consisting of the first semiconductor laser element 20 to the R-th semiconductor laser element 20 or the quantity of one semiconductor laser element 20 of the couple is one more than the quantity of the other, and the difference in quantity between the semiconductor laser element 20 of the lowest quantity and the semiconductor laser element 20 of the highest quantity is one. That is, although a quantity not divisible by R is distributed as appropriate with respect to the overall quantity, it would be safe to say that R types of semiconductor laser elements 20 are evenly disposed.

Each of the semiconductor laser elements 20 from the first semiconductor laser element 20 to the R-th semiconductor laser element 20 (where R is a natural number and R≥3) may have a difference in emission peak wavelength between the $r_1$-th semiconductor laser element 20 (where $r_1$ is a natural number and $1 \leq r_1 \leq R-1$) and the $r_1+1$-th semiconductor laser element 20 in a range from 2 nm to 10 nm. Preferably, the difference in emission peak wavelength is in a range from 2 nm to 5 nm. A difference in wavelength that is not extensively large readily contributes to a reduction in speckle noise.

The difference in emission peak wavelength between the first semiconductor laser element 20 and the R-th semiconductor laser element 20 may be 2 nm×(R−1) or greater and 10 nm×(R−1) or less. Preferably, this difference in emission peak wavelength is 2 nm×(R−1) or greater and 5 nm×(R−1) or less. Rather than being specified by the difference in emission peak wavelength between the $r_1$-th semiconductor laser element 20 and the $r_1+1$-th semiconductor laser element 20, the characteristics according to the difference in emission peak wavelength of the plurality of the semiconductor laser element 20 can be specified by the overall difference in emission peak wavelength. The emission peak wavelength need only be distributed as a whole across all of the types of semiconductor laser elements 20, even if the difference in emission peak wavelength between the $r_1$-th semiconductor laser element 20 and the $r_1+1$-th semiconductor laser element 20 is not 2 nm or greater.

In the illustrated example of the first semiconductor laser element 20A, the second semiconductor laser element 20B, and the third semiconductor laser element 20C (i.e., R=3), the difference in emission peak wavelength between the first semiconductor laser element 20A and the third semiconductor laser element 20C is greater than 4 nm (i.e., 2 nm×(3−1)). Even if each of the first semiconductor laser element 20A and the third semiconductor laser element 20C has an emission peak wavelength close to that of the second semiconductor laser element 20B, this difference is greater than 4 nm.

In an emission spectrum obtained by combining the $r_2$-th semiconductor laser element 20 (where $r_2$ is a natural number and $1 \leq r_2 \leq R-2$), the $r_2+1$-th semiconductor laser element 20, and the $r_2+2$-th semiconductor laser element 20, a spectral width of light having an intensity of $1/e^2$ or greater with respect to the peak intensity value may be in a range from 7 nm to 20 nm. Alternatively, this spectral width may be in a range from 8 nm to 15 nm. Instead of evaluation by the emission peak wavelength of two types of semiconductor laser elements 20, it is also possible to make an evaluation by widths of the emission spectra of the light of three types of semiconductor laser elements 20.

Note that this spectral width may be the difference between the larger of the two wavelengths of the $r_2$-th semiconductor laser elements 20 with an intensity of $1/e^2$ with respect to the peak intensity value in the emission spectrum and the smaller of the two wavelengths of the $r_2+2$-th semiconductor laser elements 20 with an intensity of $1/e^2$ with respect to the peak intensity value in the emission spectrum.

Furthermore, for each of the semiconductor laser elements 20 from the first semiconductor laser element 20 to the R-th semiconductor laser element 20 (where R is a natural number and R≥3), this spectrum width may be in a range from 7 nm to 20 nm. That is, regardless of the $r_2$-th semiconductor laser element 20 (where $r_2$ is a natural number and $1 \leq r_2 \leq R-2$), the $r_2+1$-th semiconductor laser element 20, and the $r_2+2$-th semiconductor laser element 20 selected from among the first semiconductor laser element 20 to the R-th semiconductor laser element 20, the spectral width of the emission spectrum obtained by combining the three types of light may be in a range from 7 nm to 20 nm.

When the spectral width of the light having an intensity of $1/e^2$ or greater with respect to the peak intensity value is $\lambda$ nm in the emission spectrum of the light emitted from the $r_2+1$-th semiconductor laser element 20, the spectral width of the light having an intensity of $1/e^2$ or greater with respect to the peak intensity value may be in a range from 1.5 nm to 10λ nm in the emission spectrum obtained by combining the light emitted from the $r_2$-th semiconductor laser element 20 (where $r_2$ is a natural number and $1 \leq r_2 \leq R-2$), the $r_2+1$-th semiconductor laser element 20, and the $r_2+2$-th semiconductor laser element 20.

In an emission spectrum obtained by combining the light emitted from the first semiconductor laser element 20A, the second semiconductor laser element 20B, and the third semiconductor laser element 20C, a spectral width of light having an intensity of $1/e^2$ or greater with respect to the peak intensity value may be in a range from 7 nm to 20 nm.

The plurality of semiconductor laser elements 20 disposed in the row direction or the column direction are disposed with the first semiconductor laser element 20 to the R-th semiconductor laser element 20 being repeated in the row direction or the column direction in a desired order. Further, this order is repeated across the plurality of columns or the plurality of rows, resulting in the plurality of semiconductor laser elements 20 disposed in a matrix. By thus arranging the plurality of semiconductor laser elements 20 in the row direction, the column direction, or the row direction and the column direction, it is possible to disperse light having the same emission peak wavelength and thus reduce the speckle noise. Further, in a case of utilization in a display or other image displays, the quality of light across the entire screen is made more uniform, making it possible to improve image quality.

Note that, when the order, regularity, and the like are described with regard to the arrangement of the semiconductor laser elements 20, it is not essential to arrange the semiconductor laser elements 20 in accordance with the order and regulations exemplified herein when actually manufacturing the light-emitting device. It is sufficient if the arrangement of the plurality of semiconductor laser elements 20 in the manufactured light-emitting device results in the arrangement having the order and the regularity exemplified here.

For example, in a case in which the first semiconductor laser element 20 to the R-th semiconductor laser element 20 are designated in a predetermined order from first to R-th, the plurality of semiconductor laser elements 20 are disposed so that, in an m-th row (where m is a natural number and $1 \leq m \leq M-1$), from a first column to an N-th column, semiconductor laser elements 20 start from the first type and a predetermined order from the first type to the R-th type is repeated. Furthermore, the plurality of semiconductor laser elements 20 are disposed so that, in the m+1-th row, from the first column to the N-th column, semiconductor laser elements 20 start from a semiconductor laser element 20 of the number following a semiconductor laser element 20 disposed in row m, column N, and the sequence is repeated according to the order from the first to the R-th.

Further, for example, in a case in which the first semiconductor laser element 20 to the R-th semiconductor laser element 20 are designated in a predetermined order from first to R-th, the plurality of semiconductor laser elements 20 are disposed so that, in an n-th column (where n is a natural number and $1 \leq n \leq N-1$), from a first row to an M-th row, semiconductor laser elements 20 start from the first and the sequence is repeated from the first to the R-th. Furthermore, the plurality of semiconductor laser elements 20 are disposed so that, in the n+1-th column, from the first row to the M-th row, semiconductor laser elements 20 start from a semiconductor laser element 20 of the number following a semiconductor laser element 20 disposed in row M, column n, and the sequence is repeated according to the order from the first to the R-th. Note that this arrangement has the same regularity as the arrangement described above, except for the difference in whether the row direction or the column direction is defined.

Further, for example, in a case in which the first semiconductor laser element 20 to the R-th semiconductor laser element 20 are designated in a predetermined order from first to R-th, the plurality of semiconductor laser elements 20 are disposed so that, in an m-th row (where m is a natural number and $1 \leq m \leq M-1$), from a first column to an N-th column, semiconductor laser elements 20 start from the first type and a predetermined order from the first type to the R-th type is repeated. Furthermore, the plurality of semiconductor laser elements 20 are disposed so that, in the m+1-th row, from the N-th column to the first column, semiconductor laser elements 20 start from a semiconductor laser element 20 of the number following a semiconductor laser element 20 disposed in row m, column N, and the sequence is repeated according to the order from the first to the R-th.

Further, for example, in a case in which the first semiconductor laser element 20 to the R-th semiconductor laser element 20 are designated in a predetermined order from first to R-th, the plurality of semiconductor laser elements 20 are disposed so that, in an n-th column (where n is a natural number and 1≤n≤N−1), from a first row to an M-th row, semiconductor laser elements 20 start from the first and the sequence is repeated from the first to the R-th. Furthermore, the plurality of semiconductor laser elements 20 are disposed so that, in the n+1-th column, from the M-th row to the first row, semiconductor laser elements 20 start from a semiconductor laser element 20 of the number following a semiconductor laser element 20 disposed in row M, column n, and the sequence is repeated from the first to the R-th. Note that this arrangement has the same regularity as the arrangement described above, except for the difference in whether the row direction or the column direction is defined.

Figure 6:
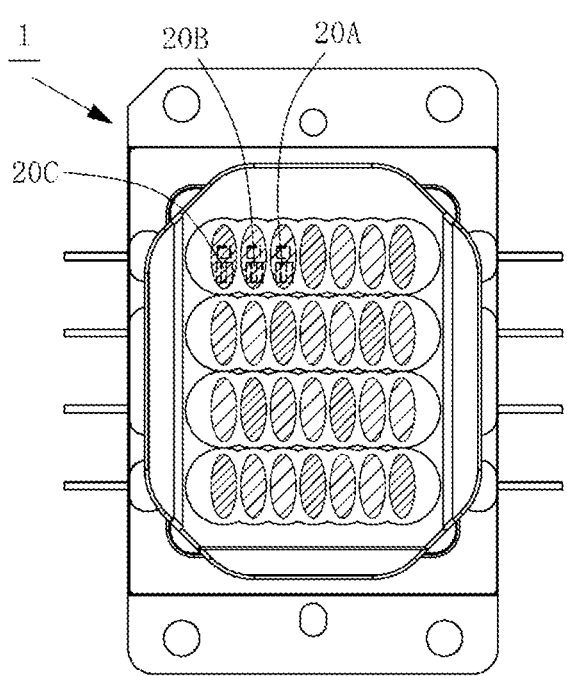
FIG. 6 is a schematic top view illustrating a first example of an array of light emitted from the light-emitting device according to the first embodiment.
Figure 7:
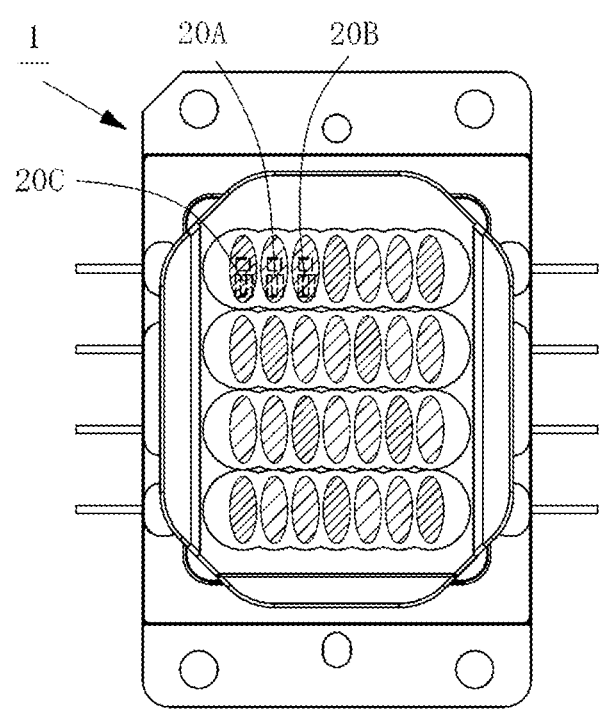
FIG. 7 is a schematic top view illustrating a second example of an array of light emitted from the light-emitting device according to the first embodiment.
Figure 8:
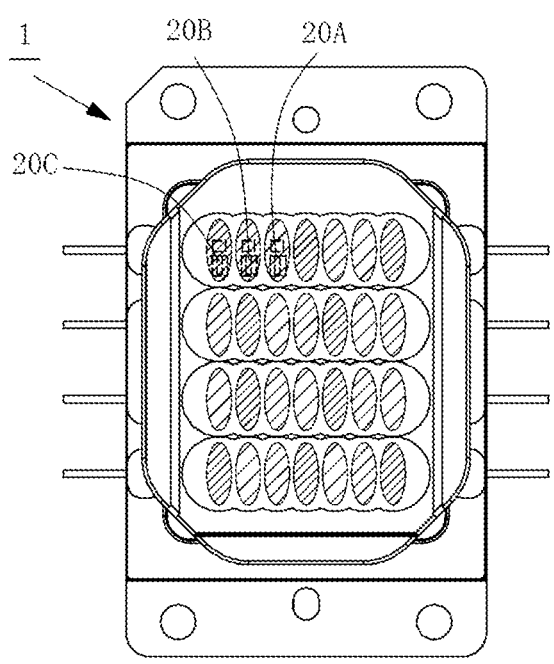
FIG. 8 is a schematic top view illustrating a third example of an array of light emitted from the light-emitting device according to the first embodiment.
Figure 9:
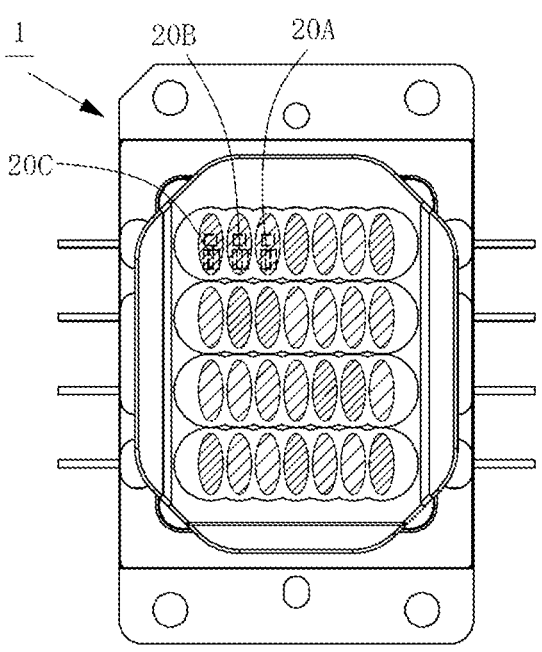
FIG. 9 is a schematic top view illustrating a fourth example of an array of light emitted from the light-emitting device according to the first embodiment.

In the M rows and the N columns, in whole or in part, in the row direction, the plurality of semiconductor laser elements 20 are disposed so that the semiconductor laser element 20 other than the first semiconductor laser element 20A is adjacent to the first semiconductor laser element 20A, the semiconductor laser element 20 other than the second semiconductor laser element 20B is adjacent to the second semiconductor laser element 20B, and the semiconductor laser element 20 other than the third semiconductor laser element 20C is adjacent to the third semiconductor laser element 20C. In addition, in the row direction, the plurality of semiconductor laser elements 20 are disposed so that the first semiconductor laser element 20A is not adjacent to the first semiconductor laser element 20A, the second semiconductor laser element 20B is not adjacent to the second semiconductor laser element 20B, and the third semiconductor laser element 20C is not adjacent to the third semiconductor laser element 20C. FIGS. 6 and 7 illustrate an example of the light-emitting device 1 in which the plurality of semiconductor laser elements 20 are thus disposed across the entirety, and FIGS. 8 and 9 illustrate an example of the light-emitting device 1 in which the plurality of semiconductor laser elements 20 are thus disposed in a portion thereof.

In the M rows and the N columns, in whole or in part, in the column direction, the plurality of semiconductor laser elements 20 are disposed so that the semiconductor laser element 20 other than the first semiconductor laser element 20A is adjacent to the first semiconductor laser element 20A, the semiconductor laser element 20 other than the second semiconductor laser element 20B is adjacent to the second semiconductor laser element 20B, and the semiconductor laser element 20 other than the third semiconductor laser element 20C is adjacent to the third semiconductor laser element 20C. In addition, in the column direction, the plurality of semiconductor laser elements 20 are disposed so that the first semiconductor laser element 20A is not adjacent to the first semiconductor laser element 20A, the second semiconductor laser element 20B is not adjacent to the second semiconductor laser element 20B, and the third semiconductor laser element 20C is not adjacent to the third semiconductor laser element 20C. FIGS. 6 and 7 illustrate an example of the light-emitting device 1 in which the plurality of semiconductor laser elements 20 are thus disposed across the entirety, and FIGS. 8 and 9 illustrate an example of the light-emitting device 1 in which the plurality of semiconductor laser elements 20 are thus disposed in a portion thereof.

The plurality of semiconductor laser elements 20 can be disposed so that, in each row direction and column direction of the M rows and N columns in whole or in part, the first semiconductor laser element 20A is not included in any of the semiconductor laser elements 20 adjacent to the first semiconductor laser element 20A, the second semiconductor laser element 20B is not included in any of the semiconductor laser elements 20 adjacent to the second semiconductor laser element 20B, and the third semiconductor laser element 20C is not included in any of the semiconductor laser elements 20 adjacent to the third semiconductor laser element 20C. FIGS. 6 and 7 illustrate an example of the light-emitting device 1 in which the plurality of semiconductor laser elements 20 are thus disposed across the entirety, and FIG. 8 and FIG. 9 illustrate an example of the light-emitting device 1 in which the plurality of semiconductor laser elements 20 are thus disposed in a portion thereof.

Furthermore, the plurality of semiconductor laser elements 20 may be disposed so that, in all semiconductor laser elements 20 disposed in the (M−1)-th row from the second row and the (N−1)-th column from the second column of the M rows and N columns as a whole, at least one first semiconductor laser element 20A is included in all semiconductor laser elements 20 adjacent to the first semiconductor laser element 20A, at least one second semiconductor laser element 20B is included in all semiconductor laser elements 20 adjacent to the second semiconductor laser element 20B, and at least one third semiconductor laser element 20C is included in all semiconductor laser elements 20 adjacent to the third semiconductor laser element 20C. Note that both M and N in this case are desirably natural numbers of 4 or greater.

That is, the plurality of semiconductor laser elements 20 are disposed so that the semiconductor laser element 20 surrounded by eight other semiconductor laser elements 20 is adjacent in the row direction, adjacent in the column direction, or obliquely adjacent to at least one semiconductor laser element 20 of the same type. FIGS. 6 to 9 illustrate examples of the light-emitting device 1 in which the plurality of semiconductor laser elements 20 are thus disposed. By being disposed in this way, the semiconductor laser elements 20 of the same type are disposed without being too far apart, and the balance of emission of the overall light from the various semiconductor laser elements 20 is maintained.

In the M rows and the N columns, in whole or in part, the plurality of semiconductor laser elements 20 are disposed so that, in the row direction, for each of the first semiconductor laser element 20 to the R-th semiconductor laser element 20, the semiconductor laser elements 20 other than the r-th semiconductor laser element 20 are adjacent to the r-th semiconductor laser element 20 and, in the row direction, the r-th semiconductor laser element 20 is not adjacent to the r-th semiconductor laser element 20. With this arrangement, it is possible to reduce the speckle noise compared to a case in which the semiconductor laser elements 20 of the same type are disposed in a concentrated manner.

In the M rows and the N columns, in whole or in part, the plurality of semiconductor laser elements 20 are disposed so that, in the column direction, for each of the first semiconductor laser element 20 to the R-th semiconductor laser element 20, the semiconductor laser elements 20 other than the r-th semiconductor laser element 20 are adjacent to the r-th semiconductor laser element 20 and, in the row direction, the r-th semiconductor laser element 20 is not adjacent to the r-th semiconductor laser element 20.

In the M rows and the N columns, the plurality of semiconductor laser element 20 are disposed so that, for each of the types of the first semiconductor laser element 20 to the R-th semiconductor laser element 20, three or more semiconductor laser elements 20 of the same type are not disposed side by side in the row direction or in the column direction. This makes it possible to reduce speckle noise.

FIGS. 6 and 7 illustrate an example of the light-emitting device 1 in which the plurality of semiconductor laser elements 20 are disposed so that the three types of semiconductor laser elements 20 of the first semiconductor laser element 20A to the third semiconductor laser element 20C are arranged side by side in the same direction in each row, in the order of the first semiconductor laser element 20A, the second semiconductor laser element 20B, and the third semiconductor laser element 20C.

FIG. 8 illustrates an example of the light-emitting device 1 in which the plurality of semiconductor laser element 20 are disposed so that the three types of semiconductor laser elements 20 of the first semiconductor laser element 20A to the third semiconductor laser element 20C are arranged side by side in the row direction, with adjacent rows being in opposite directions, in the order of the first semiconductor laser element 20A, the second semiconductor laser element 20B, and the third semiconductor laser element 20C.

FIG. 6 illustrates an example of the light-emitting device 1 in which the plurality of semiconductor laser element 20 are disposed so that the three types of semiconductor laser elements 20 of the first semiconductor laser element 20A to the third semiconductor laser element 20C are arranged side by side in the column direction, in the same direction in each column, in the order of the first semiconductor laser element 20A, the second semiconductor laser element 20B, and the third semiconductor laser element 20C.

FIG. 9 illustrates an example of the light-emitting device 1 in which the plurality of semiconductor laser element 20 are disposed so that the three types of semiconductor laser elements 20 of the first semiconductor laser element 20A to the third semiconductor laser element 20C are arranged side by side in the column direction, with adjacent columns being in opposite directions, in the order of the first semiconductor laser element 20A, the second semiconductor laser element 20B, and the third semiconductor laser element 20C.

With the semiconductor laser elements 20 of R types disposed in a matrix of M rows and N columns, preferably at least one of a value obtained by dividing M by R and a value obtained by dividing N by R is not an integer. In this way, in a case in which the value obtained by dividing M by R is not an integer, the plurality of semiconductor laser elements 20 are preferably disposed so that the semiconductor laser elements 20 of R types are arranged side by side in order in the column direction. Further, in a case in which the value obtained by dividing N by R is not an integer, the plurality of semiconductor laser elements 20 are preferably disposed so that the semiconductor laser elements 20 of R types are arranged side by side in order in the row direction. As a result, the semiconductor laser elements 20 of R types are disposed regularly, making it possible to manufacture the light-emitting device 1 with reduced speckle noise.

In the light-emitting device, the light-reflecting member 40 is disposed on the mounting surface of the base 10. The one or more light-reflecting members 40 are disposed on the mounting surface of the base 10. The light-reflecting surface of the light-reflecting member 40 faces the light-exiting surface of the semiconductor laser element 20.

The light-reflecting member 40 can be individually disposed with respect to each of the plurality of semiconductor laser elements 20. In this case, the light-emitting device 1 includes a plurality of the light-reflecting members 40, and the quantity is equal to or greater than the quantity of the semiconductor laser elements 20.

The light emitted from the plurality of semiconductor laser elements 20 side by side in the first direction may be reflected by one light-reflecting member 40. In this case, a distance between both ends of the light-reflecting member 40 in the first direction is greater than a distance between two semiconductor laser elements 20 positioned at both ends of the plurality of semiconductor laser elements 20 side by side in the first direction.

The plurality of semiconductor laser elements 20 and the plurality of light-reflecting members 40 are disposed alternately side by side in the second direction. That is, the light-reflecting member 40 is disposed between two semiconductor laser elements 20 side by side in the second direction, and the semiconductor laser element 20 is disposed between two light-reflecting members 40 side by side in the second direction.

The light of the main portion emitted from the semiconductor laser element 20 is reflected by the light-reflecting surface. The reflected light can change in travel direction and travel upward, for example. With the light-reflecting member 40 thus disposed, it is possible to arrange the light-exiting surface on a lateral surface of the semiconductor laser element 20 and emit light upward from the light-emitting device 1. The light-exiting surface of the semiconductor laser element 20 may be a primary heat source of heat emitted from the semiconductor laser element 20. For example, in a case in which the semiconductor laser element 20 is an end surface emitting type semiconductor laser element, it possible to improve heat dissipation by bringing the light-exiting surface close to the submount 30 and the body 10.

In the light-emitting device 1, the plurality of wirings 60 are used to enable power supply from the outside to the semiconductor laser elements 20. The semiconductor laser elements 20 are electrically connected to the wiring portions 14a by the plurality of wirings 60. The plurality of wirings 60 include one or more wirings 60 in which one end of both ends is joined to an inner wiring region.

The semiconductor laser elements 20 are electrically connected in series by the plurality of wirings 60. The plurality of semiconductor laser elements 20 side by side in the first direction are electrically connected in series. In the plurality of semiconductor laser elements 20 disposed in M rows and N columns, the plurality of wirings 60 are connected so that N semiconductor laser elements 20 disposed in the same row are electrically connected in series. The plurality of semiconductor laser elements 20 side by side in the second direction are not electrically connected in series. The plurality of semiconductor laser elements 20 side by side in the second direction are electrically connected in parallel.

In the light-emitting device 1, the sealing member 70 is joined to the base 10. The lower surface of the sealing member 70 is joined to an upper surface of the base 10. The sealing member 70 is joined to an upper surface of the recessed portion 10a of the base 10. The sealing member 70 is joined to an uppermost surface of the base 10.

The base 10 and the sealing member 70 are joined, thereby forming a sealed space. The semiconductor laser elements 20 are enclosed in this sealed space. The base 10 and the sealing member 70 can also be joined under a predetermined gas atmosphere, thereby forming an airtight sealed space. A package that seals the plurality of semiconductor laser elements 20 disposed in M rows and N columns is formed by the base 10 and the sealing member 70. By enclosing the semiconductor laser elements 20 in the sealed space in this way, it is possible to suppress dust collection on the light-exiting surface of the semiconductor laser elements 20 and suppress a decrease in luminous efficiency.

Light reflected by the light-reflecting member 40 passes through the sealing member 70. The light of the main portion passes through a portion of the sealing member 70 having transmissivity, and is emitted from the sealing member 70.

In the light-emitting device 1, the lens member 80 is positioned above the plurality of semiconductor laser elements 20. The lens member 80 is disposed above the sealing member 70. The lens member 80 is joined to the sealing member 70. The lens member 80 is joined using, for example, an ultra-violet (UV) curable adhesive. When a UV curable adhesive is used, the mounting position of the lens member 80 can be adjusted and then joined at a desired position.

The lens member 80 is disposed so that the light emitted from the individual semiconductor laser elements 20 is emitted through the individual lens surfaces. Light emitted from the plurality of semiconductor laser elements 20 passes through the lens portion 81. The light passing through the individual lens surface of each lens portion 81 is extracted as collimated light.

FIGS. 6 to 9 illustrate light of a main portion passing through an individual lens surface. Light having the same hatching pattern is light emitted from the same type of semiconductor laser element 20, and light having different hatching patterns is light emitted from different types of semiconductor laser elements 20. Further, hatching of a larger width indicates light emitted from the semiconductor laser element 20 having a larger emission peak wavelength. For example, the light can be arranged, from the largest hatching width, in the order of the light emitted from the first semiconductor laser element 20A, the light emitted from the second semiconductor laser element 20B, and the light emitted from the third semiconductor laser element 20C. Note that, to facilitate understanding of the correspondence between the first semiconductor laser element 20A, the second semiconductor laser element 20B, and the third semiconductor laser element 20C, and the light emitted from each of these, the semiconductor laser elements 20 and the light-reflecting members 40 are partially drawn in FIGS. 6 to 9 using dashed lines.

The array of the light illustrated in FIGS. 6 to 9 reflect the array of the semiconductor laser elements 20 as it is. That is, the light passing through the lens surfaces positioned in row m, column n (where m is a natural number and 1≤m≤M−1, and n is a natural number and 1≤n≤N−1) is the light emitted from the semiconductor laser element 20 positioned in row m, column n.

Figure 26:
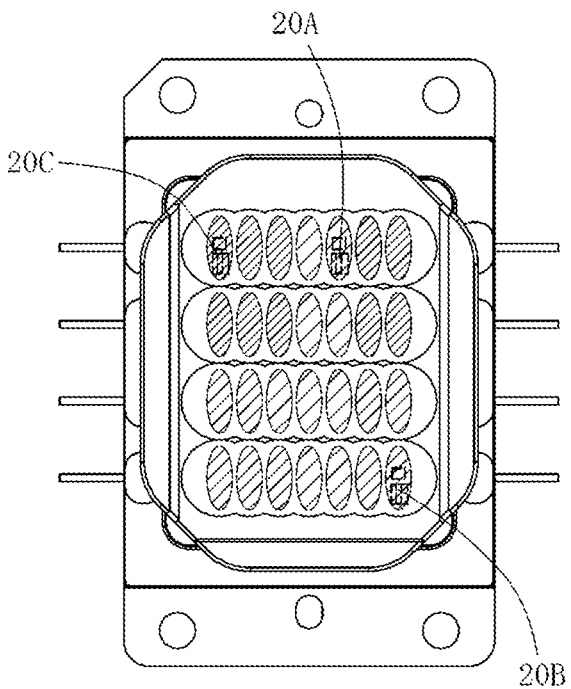
FIG. 26 is a schematic top view illustrating an example of an array of light based on a technical idea disclosed in the patent publication exemplified in the BACKGROUND.

FIG. 26 illustrates an example in which the plurality of semiconductor laser elements 20 are disposed on the basis of the technical concept disclosed in Japanese Patent Publication No. 2021-57512 described in the BACKGROUND. The quantities of the first semiconductor laser element 20A, the second semiconductor laser element 20B, and the third semiconductor laser element 20C mounted in the light-emitting device are the same as in the light-emitting device 1 illustrated in FIG. 6.

In the light-emitting device 1 illustrated in FIG. 6 and the light-emitting device illustrated in FIG. 26, the first semiconductor laser element 20A having an emission peak wavelength of 647 nm, the second semiconductor laser element 20B having an emission peak wavelength of 643 nm, and the third semiconductor laser element 20C having an emission peak wavelength of 639 nm were disposed, and the speckle noise was measured. In the light-emitting device illustrated in FIG. 26, as disclosed in Japanese Patent Publication No. 2021-57512, the first semiconductor laser element 20A having a long emission peak wavelength is disposed at a center, and the second semiconductor laser element 20B and the third semiconductor laser element 20C having emission peak wavelengths shorter than that of the first semiconductor laser element 20A are disposed at both sides. As a result of measurement, speckle noise was reduced by about 5% in the light-emitting device 1 illustrated in FIG. 6.

As the device for measuring the speckle noise, model SM01VS09 of Dr. Speckle available from Oxide Corporation was used. Light was projected toward a screen from a device provided with the light-emitting device 1 and an optical system utilized as a projection device, such as a projector, and the speckle noise of a specific region on the screen was measured by the measurement device.

Second Embodiment

Next, a light-emitting device 2 according to a second embodiment will be described. FIGS. 10 to 13 are drawings for explaining an exemplary form of the light-emitting device 2. Further, FIGS. 1 to 5 are also drawings for explaining the light-emitting device 2. FIGS. 10 to 13 are each a drawing illustrating an example of an array of light emitted from the light-emitting device 2. Note that, to facilitate understanding of the correspondence between the first semiconductor laser element 20A, the second semiconductor laser element 20B, and the third semiconductor laser element 20C, and the light emitted from each of these, the semiconductor laser elements 20 and the light-reflecting members 40 are partially drawn in FIGS. 10 to 13 using dashed lines.

The light-emitting device 2 includes a plurality of components including the base 10, the plurality of semiconductor laser elements 20, the plurality of submounts 30, the one or more light-reflecting members 40, the plurality of wirings 60, the sealing member 70, and the lens member 80. The light-emitting device 2 may further include other components.

All descriptions related to the light-emitting device 1 and the components of the first embodiment described above apply to the description of the light-emitting device 2 except for the contents that can be said to be inconsistent from the drawings of FIGS. 1 to 5 and FIGS. 10 to 13 according to the light-emitting device 2. All contents not inconsistent will not be described again in order to avoid duplication.

Compared to the light-emitting device 1, the light-emitting device 2 differs in that the quantities are not uniform among different types of semiconductor laser elements 20 of the plurality of semiconductor laser elements 20 disposed. For example, in FIGS. 10 to 12, seven first semiconductor laser elements 20A, 14 second semiconductor laser elements 20B, and seven third semiconductor laser elements 20C are disposed in a matrix of four rows and seven columns. Further, for example, in FIG. 13, eight first semiconductor laser elements 20A, 12 second semiconductor laser elements 20B, and eight third semiconductor laser elements 20C are disposed in a matrix of four rows and seven columns.

In this way, even if the quantities of the types of semiconductor laser elements 20 from the first semiconductor laser element 20 to the R-th semiconductor laser element 20 are not uniform, the plurality of semiconductor laser elements 20 can be disposed in an arrangement that contributes to a reduction in speckle noise as described for the light-emitting device 1.

In the light-emitting device 2, for the $r_2$-th semiconductor laser element 20, the $r_2$+1-th semiconductor laser element 20, and the $r_2$+2-th semiconductor laser element 20 among the first semiconductor laser element 20 to the R-th semiconductor laser element 20, the quantity of the $r_2$+1-th semiconductor laser element 20 is at least two more than the respective quantities of the $r_2$-th semiconductor laser element 20 and the $r_2$+2-th semiconductor laser element 20. The quantities are the same between the $r_2$-th semiconductor laser element 20 and the $r_2$+2-th semiconductor laser element 20 or the quantity of either one is one more than the other.

Thus, in the light-emitting device 2, in the three types of semiconductor laser elements 20 having emission peak wavelengths close to one another, the quantity of semiconductor laser elements 20 having an emission peak wavelength in the middle, that is, the second largest (or second smallest) emission peak wavelength among the three types, may be larger than the others. For example, when a large number of semiconductor laser elements 20 are manufactured, all semiconductor laser elements 20 may not have the same emission peak wavelength, and a variance may occur. In this case, it is conceivable that the closer the semiconductor laser element 20 to the originally targeted emission peak wavelength is, the greater the quantity manufactured. As long as the semiconductor laser element 20 having a wavelength range of at and near the originally targeted emission peak wavelength is set as the semiconductor laser element 20 having am emission peak wavelength in the middle of the three types, a large number of the semiconductor laser elements thus manufactured can be used efficiently taking into consideration manufacturing variances, making it possible to contribute to improvements in production efficiency and, with the suppression of waste, improvements in the environment.

In a case in which the quantities disposed are not uniform, the first semiconductor laser element 20 to the R-th semiconductor laser element 20 are repeated in the row direction or the column direction on the basis of a ratio of the quantities of the types of semiconductor laser elements 20 disposed. For example, in a case in which, of the plurality of semiconductor laser elements 20 disposed in M row and N columns, an S-th semiconductor laser element 20 (where S is a natural number and 1≤S≤R) having the smallest quantity disposed is disposed in a quantity equivalent to x1, and a T-th semiconductor laser element 20 (where T is a natural number and 1≤T≤R, T≠S) is disposed in a quantity equivalent to x2 (x1<x2), the predetermined order may be determined on the basis of y1 and y2, where x1:x2=y1:y2 (where y1 and y2 are minimum integers that satisfy this equation). In this case, in the predetermined order, the S-th semiconductor laser element 20 is registered y1 times, and the T-th semiconductor laser element 20 is registered y2 times. This is applied to all of the types of the semiconductor laser elements 20, and a predetermined order such as one in which the same type of semiconductor laser element 20 is not arranged twice continuously need only be determined.

Figure 10:
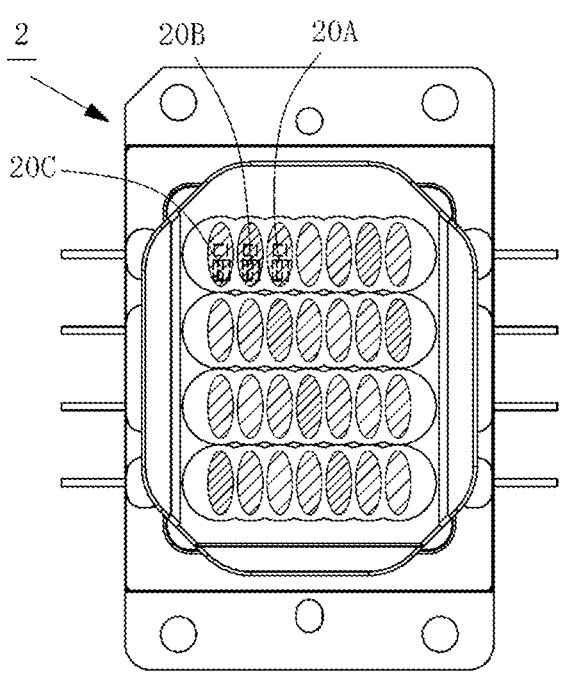
FIG. 10 is a schematic top view illustrating a first example of an array of light emitted from the light-emitting device according to the second embodiment.

For example, in a case in which seven semiconductor laser elements 20A, 14 second semiconductor laser elements 20B, and seven third semiconductor laser elements 20C are disposed, the predetermined order may be set to the first semiconductor laser element 20A, the second semiconductor laser element 20B, the third semiconductor laser element 20C, and the second semiconductor laser element 20B, and these semiconductor laser elements 20 need only be disposed in an arrangement such that this order is repeated. FIG. 10 illustrates an example of the light-emitting device 2 disposed in this manner.

Figure 11:
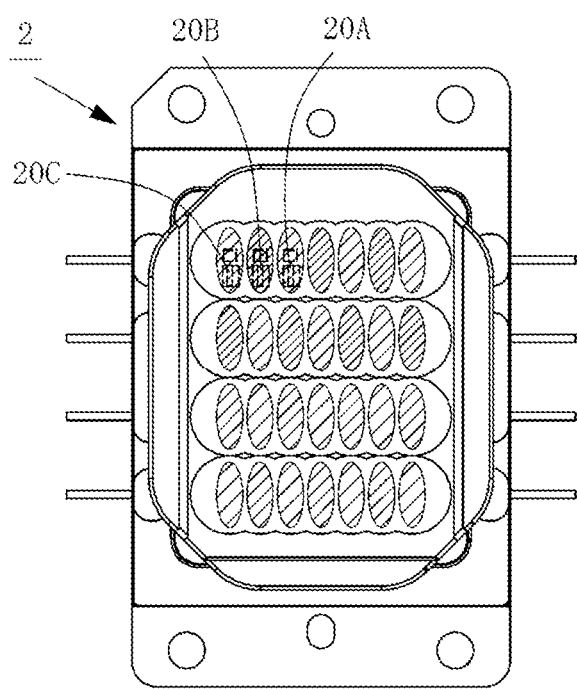
FIG. 11 is a schematic top view illustrating a second example of an array of light emitted from the light-emitting device according to the second embodiment.

Further, for example, the M rows and N columns may be divided into a plurality of regions, and a specific type of semiconductor laser element 20 may be disposed in a specific region. The M rows and N columns are divided into a plurality of regions including a first region and a second region, two or more types of semiconductor laser elements 20 among the first semiconductor laser element 20 to the R-th semiconductor laser element 20 are disposed in the first region, and two or more types of semiconductor laser elements 20 among the first semiconductor laser element 20 to the R-th semiconductor laser element 20 are disposed in the second region. In this case, the same type of semiconductor laser element 20 is not arranged twice continuously in the row direction or in the column direction. Further, in this case, the two or more types of semiconductor laser elements 20 disposed in the first region and the two or more types of semiconductor laser elements 20 disposed in the second region do not fully match. Further, in this case, the number of types of semiconductor laser elements 20 disposed in the first region and the number of types of semiconductor laser elements 20 disposed in the second region are the same. The first region and the second region are regions in row units (regions including all columns in one or more specific rows) or regions in column units (regions including all rows in one or more specific columns). FIG. 11 illustrates an example of the light-emitting device 2 disposed in this manner.

Specifically, in FIG. 11, a matrix of four rows and seven columns is divided into two regions of two rows and seven columns, seven first semiconductor laser elements 20A and seven second semiconductor laser elements 20B are disposed in one region, and seven second semiconductor laser elements 20B and seven third semiconductor laser elements 20C are disposed in the other region. In this case, 28 semiconductor laser elements 20 are disposed so that the same type of semiconductor laser element 20 is not arranged twice continuously in the row direction or the column direction.

Figure 12:
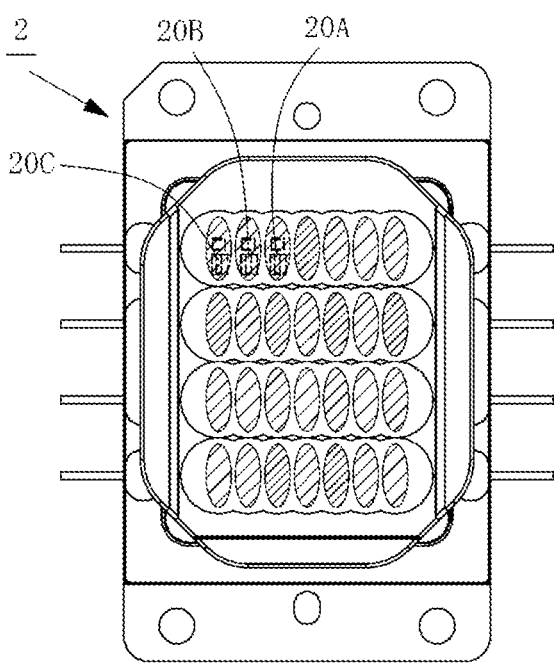
FIG. 12 is a schematic top view illustrating a third example of an array of light emitted from the light-emitting device according to the second embodiment.

Further, for example, the M rows and N columns may be divided into a plurality of regions, and the quantities of the types of the semiconductor laser elements 20 may differ in different regions. The M rows and N columns are divided into a plurality of regions including the first region and the second region, two or more types of semiconductor laser elements 20 among the first semiconductor laser element 20 to the R-th semiconductor laser element 20 are disposed in the first region, and a greater number of types of the semiconductor laser elements 20 than in the first region is disposed in the second region. In this case, the same type of semiconductor laser element 20 is not arranged twice continuously in the row direction or in the column direction. The first region and the second region are regions in row units (regions including all columns in one or more specific rows) or regions in column units (regions including all rows in one or more specific columns). FIG. 12 illustrates an example of the light-emitting device 2 disposed in this manner.

Further, for example, these conditions may be combined in a complex manner in accordance with the region. The M rows and N columns are divided into a plurality of regions including the first region, the second region, and a third region, two or more types of semiconductor laser elements 20 among the first semiconductor laser element 20 to the R-th semiconductor laser element 20 are disposed in the first region, two or more types of the semiconductor laser element 20 are disposed in the second region in the same quantity as the first region but not fully matching the types of the semiconductor laser elements 20 disposed in the first region, and a greater number of types of the semiconductor laser elements 20 than in the first region is disposed in the third region. FIG. 12 illustrates an example of the light-emitting device 2 disposed in this manner.

Specifically, in FIG. 12, four rows and seven columns are divided into four regions of one row and seven columns, the first semiconductor laser element 20A, the second semiconductor laser element 20B, and the third semiconductor laser element 20C are disposed in one of the regions, the second semiconductor laser element 20B and the third semiconductor laser element 20C are disposed in another region, the first semiconductor laser element 20A and the second semiconductor laser element 20B are disposed in yet another region, and the first semiconductor laser element 20A, the second semiconductor laser element 20B, and the third semiconductor laser element 20C are disposed in yet another region. In this case, 28 semiconductor laser elements 20 are disposed so that the same type of semiconductor laser element 20 is not arranged twice continuously in the row direction or the column direction.

Figure 13:
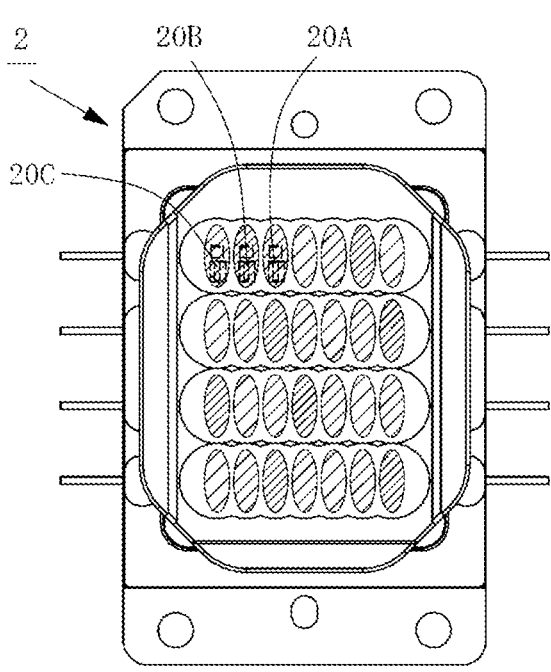
FIG. 13 is a schematic top view illustrating a fourth example of an array of light emitted from the light-emitting device according to the second embodiment.

Further, for example, a sum of the quantities of each of the first semiconductor laser element 20 to the R-th semiconductor laser element 20, given that the ratio of the disposed quantities is expressed by the smallest integer, may be the value of M or N of the matrix of M rows and N columns. In this way, the disposed quantities of the types of semiconductor laser elements 20 can be aligned between rows or between columns, and thus the entire emission balance is easily maintained. FIG. 13 illustrates an example of the light-emitting device 2 disposed in this manner.

Specifically, in FIG. 13, eight first semiconductor laser elements 20A, 12 second semiconductor laser elements 20B, and eight third semiconductor laser elements 20C are disposed in a matrix of four rows and seven columns. The ratio of the disposed quantities of the first semiconductor laser element 20A, the second semiconductor laser element 20B, and the third semiconductor laser element 20C is 2:3:2, and the sum of these is 7. This sum is the same number as the number of columns in the matrix of four rows of seven columns. Therefore, in each row, two first semiconductor laser elements 20A, three second semiconductor laser elements 20B, and two third semiconductor laser elements 20C are disposed. In this case, 28 semiconductor laser elements 20 are disposed so that the same type of semiconductor laser element 20 is not arranged twice continuously in the row direction or the column direction.

Third Embodiment

Figure 14:
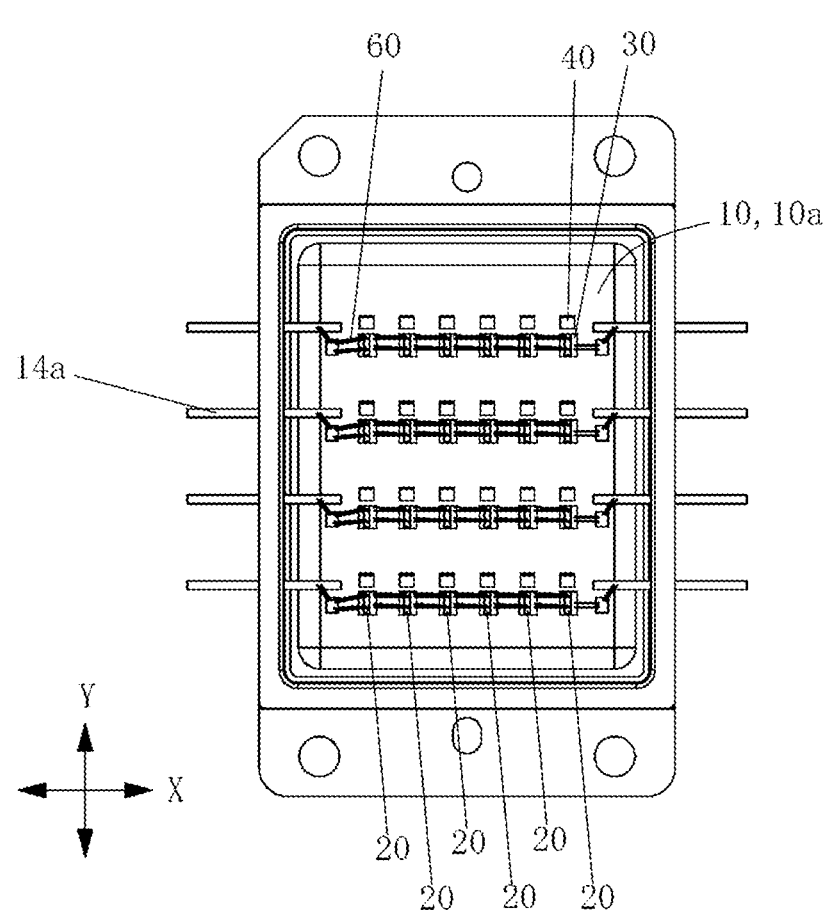
FIG. 14 is a schematic top view for explaining an array of semiconductor laser elements disposed in a package in a light-emitting device according to a third embodiment.

Next, a light-emitting device 3 according to a third embodiment will be described. FIGS. 14 to 18 are drawings for explaining an exemplary form of the light-emitting device 3. FIG. 14 is a schematic top view for explaining an array of the semiconductor laser elements 20 disposed in a package, with some components removed from the light-emitting device 3. FIGS. 15 to 18 are each a schematic top view of the light-emitting device 3, and are drawings illustrating an example of an array of light emitted from the light-emitting device 3. Note that, to facilitate understanding of the correspondence between the first semiconductor laser element 20A, the second semiconductor laser element 20B, and the third semiconductor laser element 20C, and the light emitted from each of these, the semiconductor laser elements 20 and the light-reflecting members 40 are partially drawn using dashed lines in FIGS. 15 to 18.

The light-emitting device 3 includes a plurality of components including the base 10, the plurality of semiconductor laser elements 20, the plurality of submounts 30, the one or more light-reflecting members 40, the plurality of wirings 60, the sealing member 70, and the lens member 80. The light-emitting device 3 may further include other components.

All descriptions related to the light-emitting device 1 and the components of the first embodiment and descriptions related to the light-emitting device 2 of the second embodiment described above apply to the description of the light-emitting device 3 except for the contents that can be said to be inconsistent from the drawings of FIGS. 14 to 18 according to the light-emitting device 3. All contents not inconsistent will not be described again in order to avoid duplication.

In contrast to the drawings according to the light-emitting device 1 and the light-emitting device 2 illustrating an example in which a total of 28 semiconductor laser elements 20 are disposed in a matrix of four rows and seven columns, the drawings according to the light-emitting device 3 illustrate an example in which a total of 24 semiconductor laser elements 20 are disposed in four rows and six columns. That is, the third embodiment is substantially common to the first embodiment and the second embodiment in that the plurality of semiconductor laser elements 20 are disposed in a matrix of M rows and N columns, but the specific example illustrated by the drawings is different.

Figure 15:
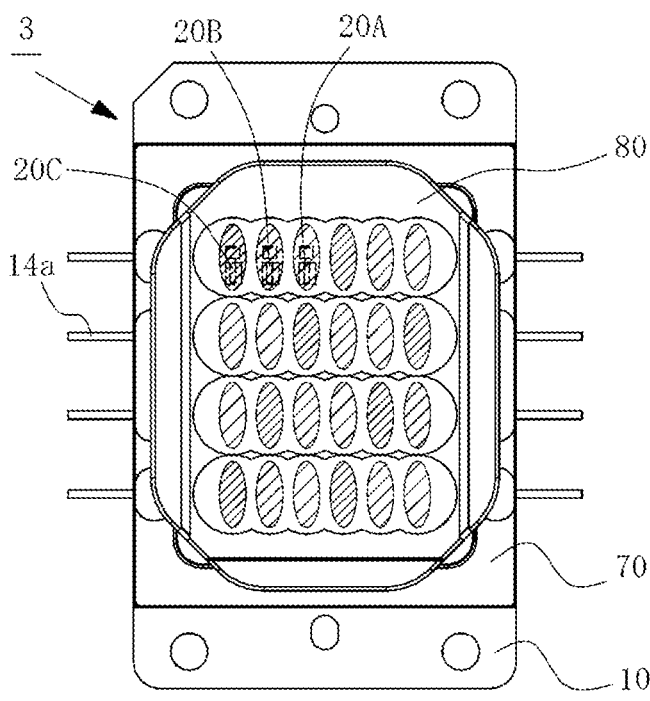
FIG. 15 is a schematic top view illustrating a first example of an array of light emitted from the light-emitting device according to the third embodiment.

For example, in a case in which the first semiconductor laser element 20 to the R-th semiconductor laser element 20 are designated in a predetermined order from first to R-th, the plurality of semiconductor laser elements 20 are disposed so that, in an n-th column (where n is a natural number and $1 \leq n \leq N-1$), from a first row to an M-th row, semiconductor laser elements 20 start from the first and the sequence is repeated from the first to the R-th. Furthermore, the plurality of semiconductor laser elements 20 are disposed so that, in the n+1-th column, from the first row to the M-th row, semiconductor laser elements 20 start from a semiconductor laser element 20 of the number following a semiconductor laser element 20 disposed in row M, column n, and the sequence is repeated in the order from the first to the R-th. FIG. 15 illustrates an example of the light-emitting device 3 disposed in this manner.

Figure 16:
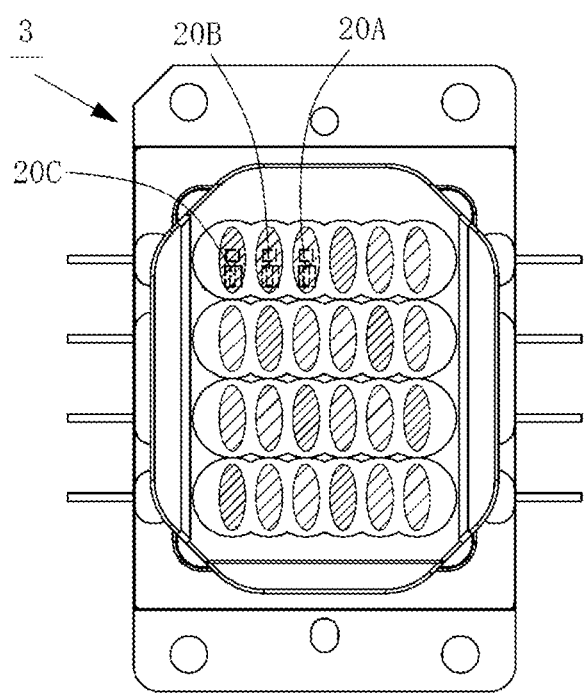
FIG. 16 is a schematic top view illustrating a second example of an array of light emitted from the light-emitting device according to the third embodiment.

For example, in a case in which the first semiconductor laser element 20 to the R-th semiconductor laser element 20 are designated in a predetermined order from first to R-th, the plurality of semiconductor laser elements 20 are disposed so that, in an n-th column (where n is a natural number and $1 \leq n \leq N-1$), from an M-th row to a first row, semiconductor laser elements 20 start from the first and the sequence is repeated from the first to the R-th. Furthermore, the plurality of semiconductor laser elements 20 are disposed so that, in the n+1-th column, from the M-th row to the first row, semiconductor laser elements 20 start from a semiconductor laser element 20 of the number following a semiconductor laser element 20 disposed in row 1, column n, and the sequence is repeated according to the order from the first to the R-th. FIG. 16 illustrates an example of the light-emitting device 3 disposed in this manner.

Figure 17:
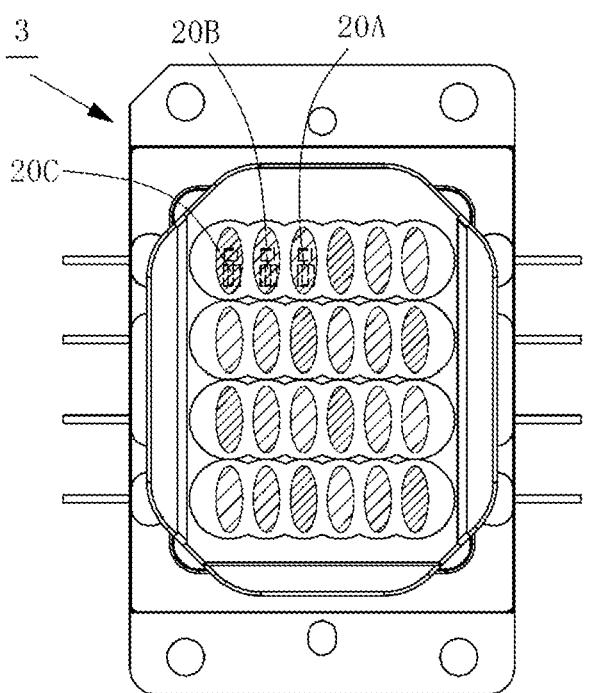
FIG. 17 is a schematic top view illustrating a third example of an array of light emitted from the light-emitting device according to the third embodiment.

Further, for example, in a case in which the first semiconductor laser element 20 to the R-th semiconductor laser element 20 are designated in a predetermined order from first to R-th, the plurality of semiconductor laser elements 20 are disposed so that, in an m-th row (where m is a natural number and 1≤m≤M−1), from a first column to an N-th column, semiconductor laser elements 20 start from the first type and a predetermined order from the first type to the R-th type is repeated. Furthermore, the plurality of semiconductor laser elements 20 are disposed so that, in the m+1-th row, from the N-th column to the first column, semiconductor laser elements 20 start from a semiconductor laser element 20 of the number following a semiconductor laser element 20 disposed in row m, column N, and the sequence is repeated according to the order from the first to the R-th. FIG. 17 illustrates an example of the light-emitting device 3 disposed in this manner.

Figure 18:
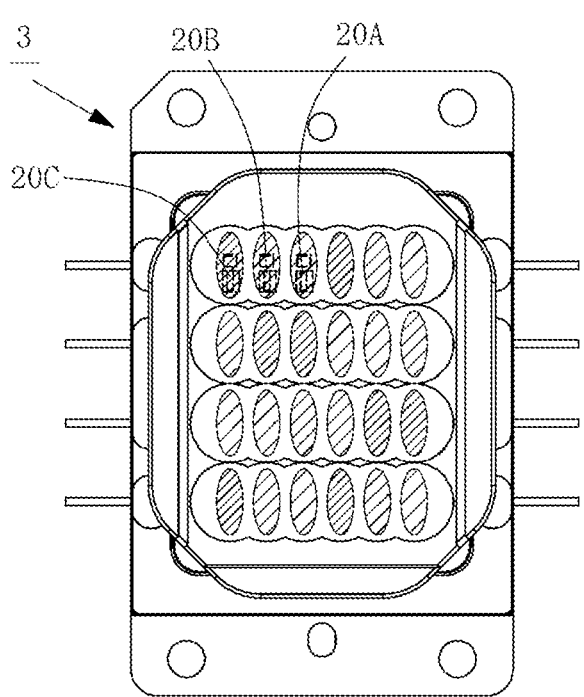
FIG. 18 is a schematic top view illustrating a fourth example of an array of light emitted from the light-emitting device according to the third embodiment.

For example, in a case in which the first semiconductor laser element 20 to the R-th semiconductor laser element 20 are designated in a predetermined order from first to R-th, the plurality of semiconductor laser elements 20 are disposed so that, in an n-th column (where n is a natural number and 1≤n≤N−1), from a first row to an M-th row, semiconductor laser elements 20 start from the first and the sequence is repeated from the first to the R-th. Furthermore, the plurality of semiconductor laser elements 20 are disposed so that, in the n+1-th column, from the M-th row to the first row, semiconductor laser elements 20 start from a semiconductor laser element 20 of the number following a semiconductor laser element 20 disposed in row M, column n, and the sequence is repeated according to the order from the first to the R-th. FIG. 18 illustrates an example of the light-emitting device 3 disposed in this manner.

As illustrated in the drawings according to the third embodiment, in a case in which three types of semiconductor laser elements 20 are disposed in a matrix of four rows and six columns, the number of columns is an integer multiple of the number of types of the semiconductor laser elements 20, and thus, when the arrangement is such that the predetermined order from the first to the third is repeated in the row direction and in the same direction across adjacent rows, the same type of semiconductor laser element 20 continues in the column direction in any column. Therefore, rather than such a regularity, an arrangement with a regularity such as described above conceivably contributes to speckle noise reduction.

Fourth Embodiment

Figure 19:
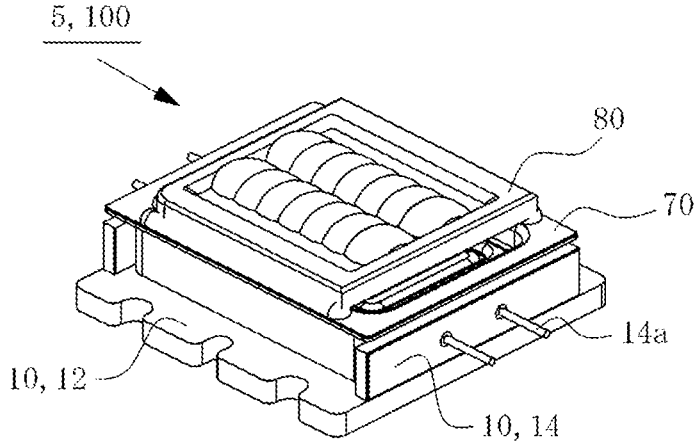
FIG. 19 is a schematic perspective view of a package according to a fourth embodiment and a light-emitting device according to a fifth embodiment.
Figure 20:
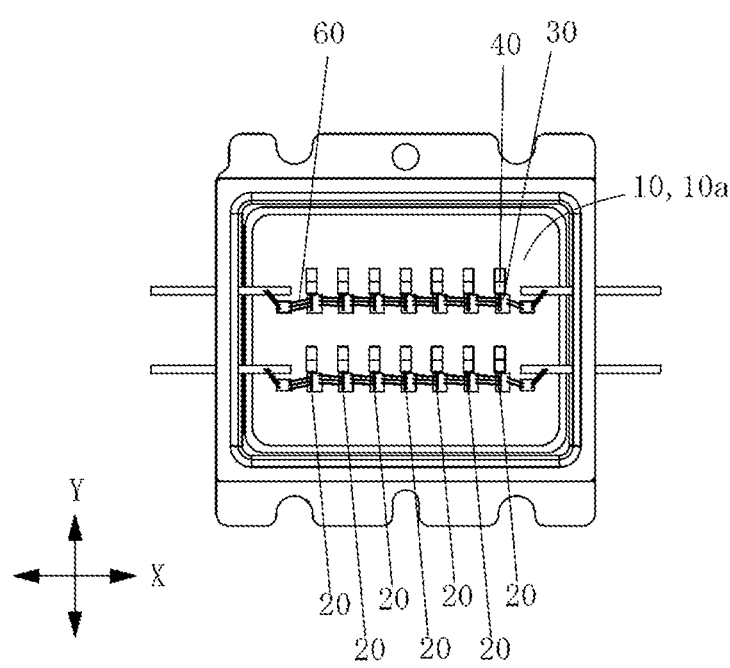
FIG. 20 is a schematic top view for explaining the package according to the fourth embodiment and an array of semiconductor laser elements 20 disposed in the light-emitting device according to the fifth embodiment.
Figure 21:
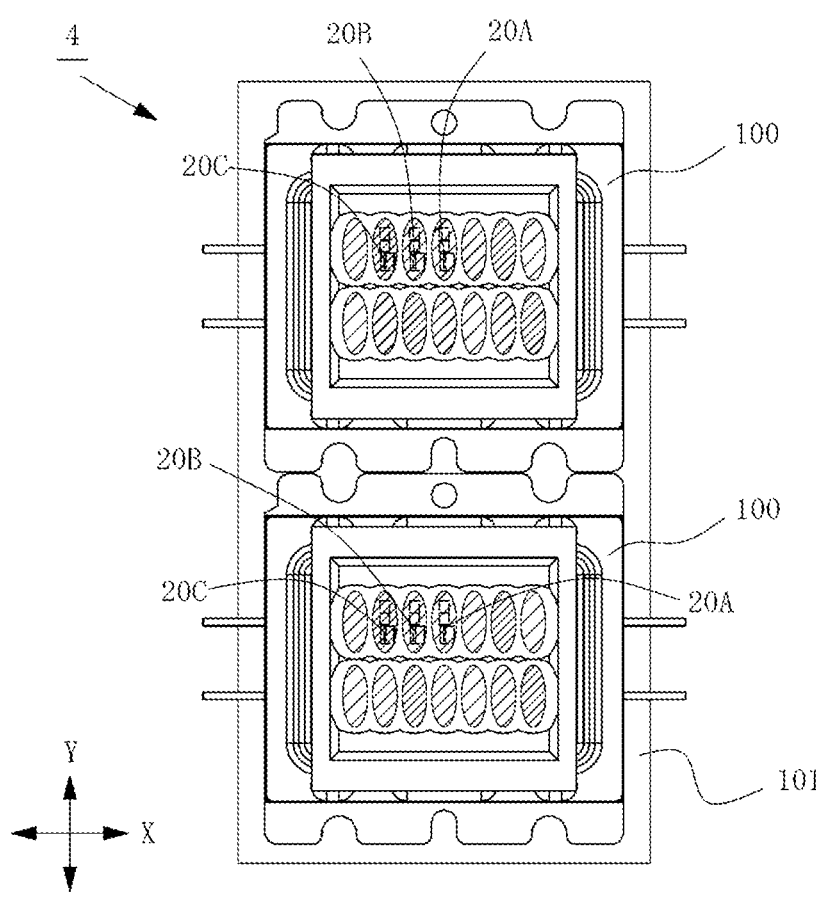
FIG. 21 is a schematic top view illustrating an example of an array of light emitted from the light-emitting device according to the fourth embodiment.

Next, a light-emitting device 4 according to a fourth embodiment will be described. FIGS. 19 to 21 are drawings for explaining an exemplary form of the light-emitting device 4. FIG. 19 is a schematic perspective view of a package 100 in which the semiconductor laser elements 20 are sealed. FIG. 20 is a schematic top view for explaining the array of the semiconductor laser elements 20 disposed in the package 100. FIG. 21 is a schematic top view of the light-emitting device 4, and is a drawing illustrating an example of an array of light emitted from the light-emitting device 4. Note that, to facilitate understanding of the correspondence between the first semiconductor laser element 20A, the second semiconductor laser element 20B, and the third semiconductor laser element 20C, and the light emitted from each of these, the semiconductor laser elements 20 and the light-reflecting members 40 are partially drawn in FIGS. 21 and 22 using dashed lines.

The light-emitting device 4 includes a plurality of the packages 100, each of which seals one or more semiconductor laser elements 20. The light-emitting device 4 includes a substrate 101 in which the plurality of packages 100 are mounted. In the light-emitting device 4, the plurality of packages 100 are mounted on the substrate 101, and thus the plurality of semiconductor laser elements 20 are disposed in a matrix of M rows and N columns as a whole.

The package 100 in which the one or more of the semiconductor laser elements 20 are sealed includes a plurality of components including the base 10, one or more of the semiconductor laser elements 20, one or more of the submounts 30, one or more of the light-reflecting members 40, the plurality of wirings 60, the sealing member 70, and the lens member 80.

All descriptions related to the light-emitting device 1 and the components of the first embodiment and descriptions related to the light-emitting devices 2 and 3 of the second embodiment and the third embodiment described above apply to the description of the light-emitting device 4 except for the contents that can be said to be inconsistent from the drawings of FIGS. 19 to 21 according to the light-emitting device 4. All contents not inconsistent will not be described again in order to avoid duplication.

The various arrangements described above can be applied to the arrangement of the plurality of semiconductor laser elements 20 in a matrix of M rows and N columns. Note that, in a form in which a plurality of the packages 100 are mounted on the substrate 101, a sequence of the semiconductor laser elements 20 in each package 100 is preferably common to each package 100. With use of the packages 100 in which the sequences of the semiconductor laser elements 20 are the same, manufacturing management is easy. FIG. 21 illustrates an example of the light-emitting device 4 disposed in this manner.

Fifth Embodiment

Figure 22:
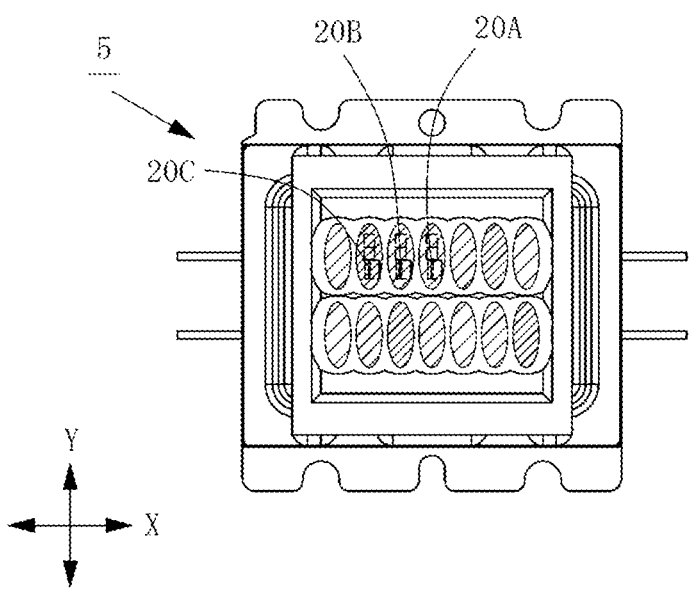
FIG. 22 is a schematic top view illustrating an example of an array of light emitted from the light-emitting device according to the fifth embodiment.

Next, a light-emitting device 5 according to a fifth embodiment will be described. FIGS. 19, 20, and 22 are drawings for explaining an exemplary form of the light-emitting device 5. FIG. 19 is a schematic perspective view of the light-emitting device 5. FIG. 20 is a schematic top view for explaining the array of the semiconductor laser elements 20 disposed in the light-emitting device 5. FIG. 22 is a schematic top view of the light-emitting device 5, and is a drawing illustrating an example of an array of light emitted from the light-emitting device 5. Note that, to facilitate understanding of the correspondence between the first semiconductor laser element 20A, the second semiconductor laser element 20B, and the third semiconductor laser element 20C, and the light emitted from each of these, the semiconductor laser elements 20 and the light-reflecting members 40 are partially drawn in FIG. 22 using dashed lines.

The light-emitting device 5 includes a plurality of components including the base 10, the plurality of semiconductor laser elements 20, the plurality of submounts 30, the one or more light-reflecting members 40, the plurality of wirings 60, the sealing member 70, and the lens member 80. The light-emitting device 5 may further include other components.

All descriptions related to the light-emitting device 1 and the components of the first embodiment and descriptions related to the light-emitting devices 2 and 3 of the second embodiment and the third embodiment described above apply to the description of the light-emitting device 5 except for the contents that can be said to be inconsistent from the drawings of FIGS. 19, 20, and 22 according to the light-emitting device 5. All contents not inconsistent will not be described again in order to avoid duplication.

In contrast to the drawings according to the light-emitting device 1 illustrating an example in which a total of 28 semiconductor laser elements 20 are disposed in a matrix of four rows and seven columns, the drawings according to the light-emitting device 5 illustrate an example in which a total of 14 semiconductor laser elements 20 are disposed in two rows and seven columns. That is, the fifth embodiment is substantially common to the first embodiment to the fourth embodiment in that the plurality of the semiconductor laser elements 20 are disposed in a matrix of M rows and N columns, but the specific example illustrated by the drawings is different.

Sixth Embodiment

Figure 23:
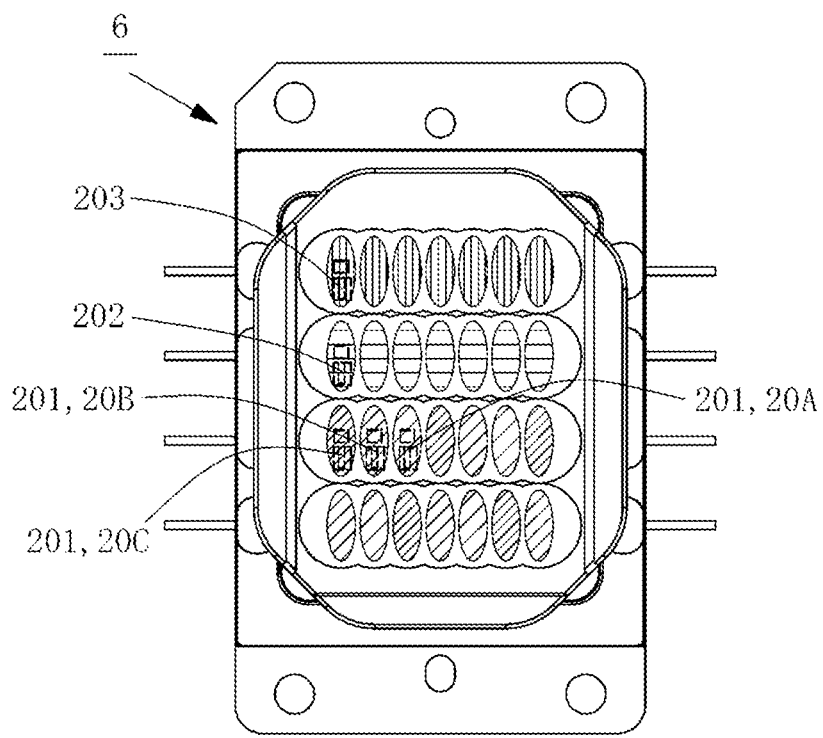
FIG. 23 is a schematic top view for explaining an example of an array of light emitted from a light-emitting device according to the sixth embodiment.

Next, a light-emitting device 6 according to a sixth embodiment will be described. FIG. 23 is a drawing for explaining an exemplary form of the light-emitting device 6. Further, FIGS. 1 to 5 are also drawings for explaining the light-emitting device 6. FIG. 23 is a drawing illustrating an example of an array of light emitted from the light-emitting device 6. Note that, to facilitate understanding of the correspondence between the first semiconductor laser element 20A, the second semiconductor laser element 20B, and the third semiconductor laser element 20C, and the light emitted from each of these, and to further facilitate understanding of the correspondence between a first color-light-emitting laser element 201, a second color-light-emitting laser element 202, and a third color-light-emitting laser element 203, and the light emitted from each of these, the semiconductor laser elements 20 and the light-reflecting members 40 are partially drawn in the figure using dashed lines.

The light-emitting device 6 includes a plurality of components including the base 10, the plurality of semiconductor laser elements 20, the plurality of submounts 30, the one or more light-reflecting members 40, the plurality of wirings 60, the sealing member 70, and the lens member 80. The light-emitting device 6 may further include other components.

All descriptions related to the light-emitting device 1 and the components of the first embodiment and descriptions related to the light-emitting devices of the second embodiment and the third embodiment described above apply to the description of the light-emitting device 6 except for the contents that can be said to be inconsistent from the drawings of FIGS. 1 to 5 and FIG. 23 according to the light-emitting device 6. All contents not inconsistent will not be described again in order to avoid duplication.

In the light-emitting device 6, the plurality of semiconductor laser elements 20 include the semiconductor laser element 20 that emits light of a first color (hereinafter referred to as a first color-light-emitting laser element 201), and the semiconductor laser element 20 that emits light of a second color (hereinafter referred to as a second color-light-emitting laser element 202). Furthermore, the plurality of semiconductor laser elements 20 include a semiconductor laser element 20 that emits light of a third color (hereinafter referred to as a third color-light-emitting laser element 203).

Alternatively, in the light-emitting device 6, the plurality of semiconductor laser elements 20 include the semiconductor laser element 20 that emits light having an emission peak wavelength of a first wavelength (in place of, or in combination with, the above; also may be referred to as the first color-light-emitting laser element 201), and the semiconductor laser element 20 that emits light having an emission peak wavelength of a second wavelength different from that of the first wavelength by 40 nm or greater (in place of, or in combination with the above; also may be referred to as the second color-light-emitting laser element

202). The plurality of semiconductor laser elements 20 include the semiconductor laser element 20 that emits light having an emission peak wavelength of a third wavelength that differs from the first wavelength by 80 nm or greater and differs from the second wavelength by 40 nm or greater (in place of, or in combination with, the above; hereinafter also referred to as the third color-light-emitting laser element 203).

The plurality of semiconductor laser elements 20 may be configured to include a semiconductor laser element including an active layer formed of a GaAs-based material or a GaP-based material and a semiconductor laser element including an active layer formed of a GaN-based material. For example, the plurality of semiconductor laser elements 20 can be configured to include a semiconductor laser element including an active layer formed of a GaAs-based material or a GaP-based material as the first color-light-emitting laser element 201, and include a semiconductor laser element including an active layer formed of a GaN-based material as the second color-light-emitting laser element 202.

Further, in the light-emitting device 6, the plurality of semiconductor laser elements 20 include a plurality of the first color-light-emitting laser elements 201 disposed in a matrix of M rows and N columns. The plurality of first color-light-emitting laser elements 201 include the semiconductor laser elements 20 from the first semiconductor laser element 20 to the R-th semiconductor laser element 20 (where R is a natural number and R≥3) so that the number of semiconductor laser elements 20 per type is two or more. Here, the first semiconductor laser element 20 to the R-th semiconductor laser element 20 are the same as or similar to the first semiconductor laser element 20 to the R-th semiconductor laser element 20 in the embodiments described above. Further, the various arrangements described above can be applied to the arrangement of the plurality of first color-light-emitting laser elements 201 in a matrix of M rows and N columns. Accordingly, the plurality of semiconductor laser elements 20 are disposed in a matrix of (M+1) rows or more, or (N+1) columns. Note that a magnitude relationship between the emission peak wavelengths of the first color-light-emitting laser elements 201, the second color-light-emitting laser elements 202, and the third color-light-emitting laser elements 203 is not related to the widths of the hatchings in the drawing.

In the light-emitting device 6 shown in the figure, the plurality of semiconductor laser elements 20 are disposed in a matrix of four rows and seven columns, and the plurality of first color-light-emitting laser elements 201 are disposed in a matrix of two rows and seven columns. The plurality of second color-light-emitting laser elements 202 are disposed in one row and seven columns. The third color-light-emitting laser elements 203 are disposed in one row and seven columns. In FIG. 23, light emitted from the second color-light-emitting laser elements are denoted by the same hatching. Further, light emitted from the third color-light-emitting laser elements are denoted by the same hatching.

The first color-light-emitting laser element 201, the second color-light-emitting laser element 202, and the third color-light-emitting laser element 203 emit light having colors different from one another and emit light of a color selected from red light, green light, and blue light. For example, the first color-light-emitting laser element 201 emits red light. Alternatively, for example, the first color-light-emitting laser elements 201 emit green light. Alternatively, for example, the first color-light-emitting laser element 201 emits blue light.

The light-emitting device 6 can include a plurality of the second color-light-emitting laser elements 202. The light-emitting device 6 can include a plurality of the third color-light-emitting laser elements 203. In the light-emitting device 6, the plurality of second color-light-emitting laser elements 202 are constituted by one or more types of the semiconductor laser elements 20. That is, the plurality of second color-light-emitting laser elements 202 may be constituted by the semiconductor laser elements 20 having the same emission peak wavelength. Note that "the same emission peak wavelength" here means that the difference in emission peak wavelength of the individual semiconductor laser elements 20 is less than 3 nm. Whether the arrangement for reducing speckle noise is selected or not may be determined depending on a specific color or wavelength band, or other colors or wavelength bands.

Seventh Embodiment

Figure 24:
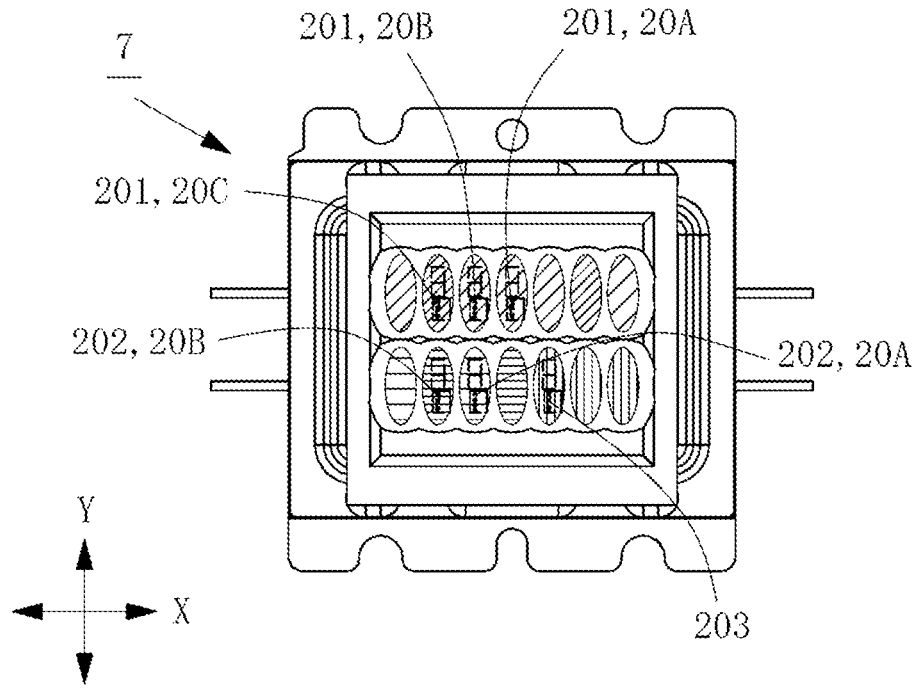
FIG. 24 is a schematic top view for explaining an example of an array of light emitted from a light-emitting device according to the seventh embodiment.

Next, a light-emitting device 7 according to a seventh embodiment will be described. FIG. 24 is a drawing for explaining an exemplary form of the light-emitting device 7. Further, FIGS. 19 and 20 are also drawings for explaining the light-emitting device 7. FIG. 24 is a drawing illustrating an example of an array of light emitted from the light-emitting device 7. Note that, to facilitate understanding of the correspondence between the first semiconductor laser element 20A, the second semiconductor laser element 20B, and the third semiconductor laser element 20C, and the light emitted from each of these, and to further facilitate understanding of the correspondence between a first color-light-emitting laser element 201, a second color-light-emitting laser element 202, and a third color-light-emitting laser element 203, and the light emitted from each of these, the semiconductor laser elements 20 and the light-reflecting members 40 are partially drawn in the figure using dashed lines. In FIG. 24, not only for the first color-light-emitting laser element 201, but also for the second color-light-emitting laser element 202, hatching of a larger width indicates light emitted from the semiconductor laser element 20 having a larger emission peak wavelength.

The light-emitting device 7 includes the package 100 sealing the one or more semiconductor laser elements 20. The package 100 in which the plurality of semiconductor laser elements 20 are sealed includes a plurality of components including the base 10, the plurality of semiconductor laser elements 20, the plurality of submounts 30, the one or more of light-reflecting members 40, the plurality of wirings 60, the sealing member 70, and the lens member 80.

All descriptions related to the light-emitting device 1 and the components of the first embodiment and descriptions related to the light-emitting devices of the second embodiment and the sixth embodiment described above apply to the description of the light-emitting device 7 except for the contents that can be said to be inconsistent from the drawings of FIGS. 19, 20, and 24 according to the light-emitting device 7. All contents not inconsistent will not be described again in order to avoid duplication.

The plurality of semiconductor laser elements 20 included in the light-emitting device 7 include the plurality of first color-light-emitting laser elements 201 and the plurality of second color-light-emitting laser elements 202. The plurality of semiconductor laser elements 20 included in the light-emitting device 7 further include the one or more third color-light-emitting laser elements 203. The first color light and the second color light have colors different from each other. The third color light has a color different from the first color light and the second color light.

In the light-emitting device 7, for example, the first color-light-emitting laser elements 201 is a semiconductor laser element 20 that emits red light. The second color-light-emitting laser elements 202 is, for example, a semiconductor laser element 20 that emits green light. The third color-light-emitting laser elements 203 is, for example, a semiconductor laser element 20 that emits blue light.

In the light-emitting device 7, the plurality of first color-light-emitting laser elements 201 include the semiconductor laser elements 20 from the first semiconductor laser element 20 to the R-th semiconductor laser element 20 (where R is a natural number and R≥3). The numbers of the semiconductor laser elements 20 from the first semiconductor laser element 20 to the R-th semiconductor laser element 20 are each two or more.

In the light-emitting device 7, the plurality of second color-light-emitting laser elements 202 include the semiconductor laser elements 20 from the first semiconductor laser element 20 to the V-th semiconductor laser element 20 (where V is a natural number and 2≤V≤(R−1)). The first semiconductor laser element 20 to the V-th semiconductor laser element 20 are V types of semiconductor laser elements 20 in which a semiconductor laser element 20 with a larger ordinal number has a shorter emission peak wavelength. That is, in the light-emitting device 7, the number of the types of the second color-light-emitting laser elements 202 is smaller than the number of the types of the first color-light-emitting laser elements 201.

In the light-emitting device 7, the plurality of third color-light-emitting laser elements 203 include the semiconductor laser elements 20 from the first semiconductor laser element 20 to the W-th semiconductor laser element 20 (where W is a natural number and 1≤W≤(V−1)). The first semiconductor laser element 20 to the W-th semiconductor laser element 20 are W types of semiconductor laser elements 20 in which a semiconductor laser element 20 with a larger ordinal number has a shorter emission peak wavelength. That is, in the light-emitting device 7, the number of the types of the third color-light-emitting laser elements 203 is smaller than the number of the types of the second color-light-emitting laser elements 202.

Such differences of the number of the types are, for example, attributed to the difference of the conspicuity of the observed speckle noise. In a case in which displaying is performed with RGB light in such a case, for example, the speckle noise is noticeable in green light or red light than in blue light, and therefore it is preferable that the number of the semiconductor laser elements 20 emitting green light or the semiconductor laser elements 20 emitting red light is greater than the number of the semiconductor elements 20 emitting blue light.

Such differences of the number of the types are, for example, attributed to the difference of the number of the semiconductor laser elements 20 mounted in the light-emitting device. The speckle noise can be reduced by decentralizing the emission peak wavelengths of light from the plurality of semiconductor laser elements 20, but not concentrating in one peak, in relatively narrow wavelength range. The effect of this decentralization becomes better with small variance of peak light intensity per decentralized emission peak wavelength. Accordingly, the effects of the speckle noise reduction differ depending on the balance between the number of the decentralized emission peak wavelengths and the variance degree of the peak light intensities.

In a case in which six semiconductor laser elements 20 emitting the same color light are disposed in the light-emitting device 7, the number of the decentralized emission peak wavelengths can be three. In a case of four decentralized emission peak wavelengths, the number of the semiconductor laser element 20 emitting light having a certain emission peak wavelength is one, and the number of the semiconductor laser elements 20 emitting light having another emission peak wavelength is two. This causes a large variance of the peak light intensities. In a case in which the number of the decentralized emission peak wavelengths is six, the variance is reduced, but the wavelength range in which the six emission peak wavelengths are included can become large.

In a case in which four semiconductor laser elements 20 emitting the same color light are disposed in the light-emitting device 7, the number of the decentralized emission peak wavelengths can be two. In a case in which the number of the decentralized emission peak wavelengths is three, the number of the semiconductor laser element 20 emitting light having a certain emission peak wavelength is one, and the number of the semiconductor laser elements 20 emitting light having another emission peak wavelength is two. This causes a large variance of the peak light intensities. In the case of four decentralized emission peak wavelengths, the variance is reduced, but the wavelength range in which the four emission peak wavelengths are included can become large.

In a case in which three semiconductor laser elements 20 emitting the same color light are disposed in the light-emitting device 7, the number of the decentralized emission peak wavelengths can be three. In a case in which the number of the decentralized emission peak wavelengths is two, the number of the semiconductor laser element 20 emitting light having a certain emission peak wavelength is one, and the number of the semiconductor laser elements 20 emitting light having another emission peak wavelength is two. This causes a large variance of the peak light intensities.

As an example of a preferable form, in the case in which the number of the semiconductor laser elements 20 emitting the same color light are three among the plurality of semiconductor laser elements in the light-emitting device, these three semiconductor laser elements 20 can be configured of three types of semiconductor laser elements 20. In the case in which the number of the semiconductor laser elements 20 emitting the same color light are four among the plurality of semiconductor laser elements in the light-emitting device, these four semiconductor laser elements 20 are preferably configured of two types of semiconductor laser elements 20. In the case in which the number of the semiconductor laser elements 20 emitting the same color light are six or more among the plurality of semiconductor laser elements in the light-emitting device, these six or more semiconductor laser elements 20 are preferably configured of three types of semiconductor laser elements 20.

In the case in which the number of the semiconductor laser elements 20 emitting the same color light are seven or more, and the light-emitting device has a configuration in which three types of the semiconductor laser elements 20 are evenly disposed, the number difference of each type of the semiconductor laser elements 20 is one at most, and the number of the semiconductor laser elements 20 is at least two in each type. In this case, the variance extent of the peak light intensity attributed to one difference in the number of the semiconductor laser elements 20 becomes relatively small, the semiconductor laser elements 20 can be configured of three types thereof.

The light-emitting device 7 shown in the figure includes six or more first color-light-emitting laser elements 201 and four second color-light-emitting laser elements 202. Six or more first color-light-emitting laser elements 201 are configured of three types of the semiconductor laser elements 20 from the first semiconductor laser element 20 to the R-th semiconductor laser element 20 (R=3). Four second color-light-emitting laser elements 202 are configured of two types of the semiconductor laser elements 20 from the first semiconductor laser element 20 to the V-th semiconductor laser element 20 (V=2). In this way, in the light-emitting device including the semiconductor laser elements emitting the same color light, the number of the decentralized emission peak wavelengths can be determined according to the number of the mounted semiconductor laser elements emitting the same color light, per color. This can contribute to speckle noise reduction.

In the light-emitting device 7 shown in the figure, the plurality of second color-light-emitting laser elements 202 are disposed so that a semiconductor laser element 20 other than the first semiconductor laser element 20A is adjacent to the first semiconductor laser element 20A, and a semiconductor laser element 20 other than the second semiconductor laser element 20B is adjacent to the second semiconductor laser element 20B, in the row direction in whole or in part in a matrix of M rows and N columns. Further, the plurality of second color-light-emitting laser elements 202 are disposed so that the first semiconductor laser element 20A is not adjacent to the first semiconductor laser element 20A, and the second semiconductor laser element 20B is not adjacent to the second semiconductor laser element 20B, in the row direction In the light-emitting device 7 shown in the figure, the number of the first semiconductor laser elements 20A is greatest in the first color-light-emitting laser elements 201 configuring three types of the semiconductor laser elements 20.

The light-emitting device 7 shown in the figure includes the plurality of semiconductor laser elements 20 that emits red light, the plurality of semiconductor laser elements 20 that emits green light, and the plurality of semiconductor laser elements 20 that emits blue light. The plurality of semiconductor laser elements that emits blue light (i.e., the third color-light-emitting laser elements 203) are disposed without being grouped into plurality types of semiconductor laser elements. In other words, the third color-light-emitting laser elements 203 are configured of one type of semiconductor laser elements 20.

In a case in which the plurality of third color-light-emitting laser elements 203 are configured of one type of semiconductor laser elements 20, peak emission wavelengths of the plurality of third color-light-emitting laser elements 203 may or may not be the same because the emission peak wavelength(s) is not grouped by the wavelength range. As with the first color-light-emitting laser elements 201 grouped into the plurality of groups by the wavelength range, the difference of the emission peak wavelengths between the plurality of third color-light-emitting laser elements 203 can be in a range from 2 nm to 10 nm, or in a range from 2 nm to 5 nm. The emission peak wavelength difference between the plurality of third color-light-emitting laser elements 203 may be smaller than 2 nm, or greater than 10 nm.

In the light-emitting device 7, the plurality of second color-light-emitting laser elements 202 can be configured of two types of semiconductor laser elements 20 that are the first semiconductor laser elements 20A having a wavelength in a range of 527 nm<emission peak wavelength<532 nm, and the second semiconductor laser elements 20B having a wavelength in a range of 518 nm<emission peak wavelength<523 nm. Alternatively, the plurality of second color-light-emitting laser elements 202 can be configured of two types of semiconductor laser elements 20 that are the first semiconductor laser elements 20A having a wavelength in a range of 534 nm<emission peak wavelength<539 nm, and the second semiconductor laser elements 20B having a wavelength in a range of 525 nm<emission peak wavelength<530 nm.

Eighth Embodiment

Figure 25:
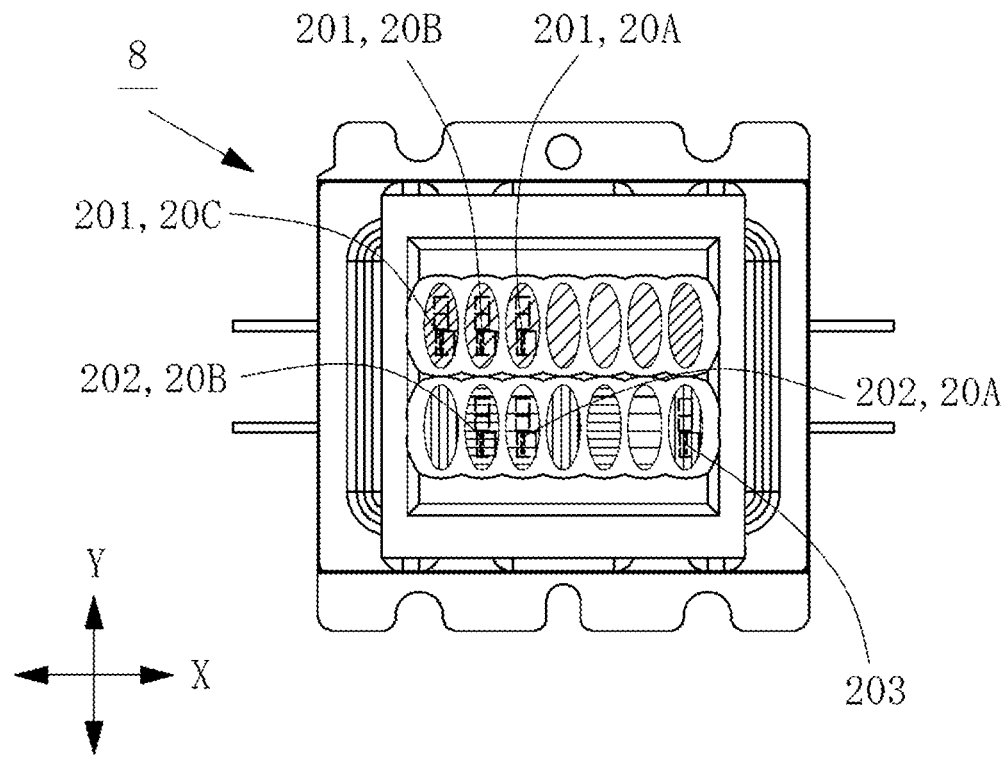
FIG. 25 is a schematic top view for explaining an example of an array of light emitted from a light-emitting device according to the eighth embodiment.

Next, a light-emitting device 8 according to an eighth embodiment will be described. FIG. 25 is a drawing for explaining an exemplary form of the light-emitting device 8. Further, FIGS. 19 and 20 are also drawings for explaining the light-emitting device 8. FIG. 25 is a drawing illustrating an example of an array of light emitted from the light-emitting device 8. Note that, to facilitate understanding of the correspondence between the first semiconductor laser element 20A, the second semiconductor laser element 20B, and the third semiconductor laser element 20C, and the light emitted from each of these, and to further facilitate understanding of the correspondence between a first color-light-emitting laser element 201, a second color-light-emitting laser element 202, and a third color-light-emitting laser element 203, and the light emitted from each of these, the semiconductor laser elements 20 and the light-reflecting members 40 are partially drawn in the figure using dashed lines. In FIG. 25, not only for the first color-light-emitting laser element 201, but also for the second color-light-emitting laser element 202, hatching of a larger width indicates light emitted from the semiconductor laser element 20 having a larger emission peak wavelength.

The light-emitting device 8 includes the package 100 sealing the plurality of semiconductor laser elements 20. The package 100 in which the plurality of semiconductor laser elements 20 are sealed includes a plurality of components including the base 10, the plurality of semiconductor laser elements 20, the plurality of submounts 30, the one or more light-reflecting members 40, the plurality of wirings 60, the sealing member 70, and the lens member 80.

All descriptions related to the light-emitting device 1 and the components of the first embodiment and descriptions related to the light-emitting devices of the second embodiment and the seventh embodiment described above apply to the description of the light-emitting device 8 except for the contents that can be said to be inconsistent from the drawings of FIGS. 19, 20, and 25 according to the light-emitting device 8. All contents not inconsistent will not be described again in order to avoid duplication.

In the light-emitting device 8 shown in the figure, in the first color-light-emitting laser elements 201 configured of three types of semiconductor laser elements 20, the plurality of first semiconductor laser elements 20A and the plurality of second semiconductor laser elements 20B are disposed between two third semiconductor laser elements 20C in the row direction. This can expect temperature characteristic improvement in addition to the speckle noise reduction.

As described above, the present invention having the technical features disclosed in the specification is not necessarily limited to the structure described in the embodiments of the specification. For example, the present invention can be applied to a light-emitting device including components not disclosed in the embodiments, and a difference from the disclosed structure does not constitute a basis for not being able to apply the present invention. Further, in terms of the smallest components for completing the invention, it can be said that the components of the light-emitting device disclosed by the embodiments can also include components not required.

This means that the light-emitting devices disclosed according to the embodiments of this specification each include not only a viewpoint of completion of the invention but also a viewpoint of disclosure of a rational configuration when one form of usage (one manufactured product, for example) is assumed. While the application of the invention is not limited to the exemplary forms of usage, there is also an aspect that the invention works effectively by being applied to these forms of usage.

From such a point of view, it may not be essential to include all of the components disclosed in one embodiment in the present invention (scope of the claims). For example, in a case in which a portion of the components of the light-emitting device disclosed by an embodiment are not stated in the scope of the claims, the components are not limited to those disclosed in the embodiment, and the degree of freedom in design by those skilled in the art, such as substitutions, omissions, shape modifications, and material changes, is acknowledged, and demands that the invention stated in the scope of the claims is applied thereupon.

The light-emitting device and the optical member described in the embodiments can be utilized in a projector. That is, the projector can be said to be one form of usage to which the present invention is applied. The present invention is not limited thereto, and can be utilized in lighting, on-vehicle headlights, head-mounted displays, light sources such as backlights of other displays, and the like.

What is claimed is:

1. A light-emitting device comprising:

a plurality of semiconductor laser elements including a plurality of first color-light-emitting laser elements that emit red light, the first color-light-emitting laser elements including first to R-th types of semiconductor laser elements (where R is a natural number and R≥3) arrayed in a matrix of M rows and N columns (where M is a natural number and M≥2, and N is a natural number and N≥3), wherein the first color-light-emitting laser elements include two or more first semiconductor laser elements, as the first type of semiconductor laser elements, each having an emission peak wavelength of smaller than 647 nm±2 nm, two or more second semiconductor laser elements, as the second type of the semiconductor laser elements, each having an emission peak wavelength of smaller than 643 nm±2 nm, and two or more third semiconductor laser elements, as the third type of semiconductor laser elements, each having an emission peak wavelength of smaller than 639 nm±2 nm, and in the M rows and the N columns, in whole or in part, the first color-light-emitting laser elements are disposed so that in a row direction, a semiconductor laser element other than the two or more first semiconductor laser elements is adjacent to any one of the two or more first semiconductor laser elements, a semiconductor laser element other than the two or more second semiconductor laser elements is adjacent to any one of the two or more second semiconductor laser elements, and a semiconductor laser element other than the two or more third semiconductor laser elements is adjacent to any one of the two or more third semiconductor laser elements, in the row direction, any one of the two or more first semiconductor laser elements is not adjacent to any one of the two or more first semiconductor laser elements, any one of the two or more second semiconductor laser elements is not adjacent to any one of the two or more second semiconductor laser element, and any one of the two or more third semiconductor laser elements is not adjacent to any one of the two or more third semiconductor laser elements, a plurality of the semiconductor laser elements arranged in the same row are electrically connected in series, and a value obtained by dividing N by R is not an integer.

2. The light-emitting device according to claim 1, wherein in the M rows and the N columns, in whole or in part, the first color-light-emitting laser elements are disposed so that in a column direction, a semiconductor laser element other than the two or more first semiconductor laser elements is adjacent to any one of the two or more first semiconductor laser elements, a semiconductor laser element other than the two or more second semiconductor laser elements is adjacent to any one of the two or more second semiconductor laser elements, and a semiconductor laser element other than the two or more third semiconductor laser elements is adjacent to any one of the two or more third semiconductor laser elements, and in the column direction, any one of the two or more first semiconductor laser elements is not adjacent to any one of the two or more first semiconductor laser elements, any one of the two or more second semiconductor laser elements is not adjacent to any one of the two or more second semiconductor laser element, and any one of the two or more third semiconductor laser elements is not adjacent to any one of the two or more third semiconductor laser elements.

3. The light-emitting device according to claim 1, further comprising a plurality of wirings electrically connecting the semiconductor laser elements to electrically and serially connect N semiconductor laser elements disposed in the same row among the semiconductor laser elements.

4. The light-emitting device according to claim 1, wherein a number of semiconductor laser elements in each of the first to the R-th type is two or more, and among the first type to the R-th type of semiconductor laser elements, a type with a larger ordinal number has a shorter emission peak wavelength.

5. The light-emitting device according to claim 4, wherein in an m-th row (where m is a natural number and $1 \leq m \leq M-1$), from a first column to an N-th column, the semiconductor laser elements are arranged starting from the first type and a predetermined order from the first type to the R-th type is repeated, and in the m+1-th row, from the first column to the N-th column, the semiconductor laser elements are arranged starting from a semiconductor laser element of an ordinal number following an ordinal number of a semiconductor laser element disposed in row m, column N, and a sequence is repeated according to the predetermined order from the first type to the R-th type.

6. The light-emitting device according to claim 4, wherein in an m-th row (where m is a natural number and $1 \leq m \leq M-1$), from a first column to an N-th column, the semiconductor laser elements are arranged starting from the first type and a predetermined order from the first type to the R-th type is repeated, and in the m+1-th row, from the N-th column to the first column, the semiconductor laser elements are arranged starting from a semiconductor laser element of an ordinal number following an ordinal number of a semiconductor laser element disposed in row m, column N, and a sequence is repeated according to the predetermined order from the first type to the R-th type.

7. The light-emitting device according to claim 1, wherein the first color-light-emitting laser elements are disposed so that, in each row direction and column direction of the M rows and the N columns as a whole, any one of the two or more first semiconductor laser elements is not included in semiconductor laser elements adjacent to any one of the two or more first semiconductor laser elements, any one of the two or more second semiconductor laser elements is not included in semiconductor laser elements adjacent to any one of the two or more second semiconductor laser elements, and any one of the two or more third semiconductor laser elements is not included in semiconductor laser elements adjacent to any one of the two or more third semiconductor laser element.

8. The light-emitting device according to claim 1, wherein the first color-light-emitting laser elements are disposed so that, in the M rows and the N columns as a whole, at least one of the two or more first semiconductor laser elements is included in all of the semiconductor laser elements adjacent to any one of the two or more first semiconductor laser elements, at least one of the two or more second semiconductor laser elements is included in all of the semiconductor laser elements adjacent to any one of the two or more second semiconductor laser elements, and at least one of the two or more third semiconductor laser elements is included in all of the semiconductor laser elements adjacent to any one of the two or more third semiconductor laser elements.

9. The light-emitting device according to claim 1, wherein each of the first color-light-emitting laser elements is a semiconductor laser element including an active layer formed of a GaAs-based material or a GaP-based material.

10. The light-emitting device according to claim 1, further comprising:

a plurality of packages each sealing one or more of the semiconductor laser elements; and a base portion on which the packages are mounted, wherein

37 the semiconductor laser elements are arrayed in the matrix of the M rows and the N columns by disposing the packages on the base portion.

11. The light-emitting device according to claim 1, further comprising a package including a mounting surface on which the semiconductor laser elements are disposed, the package sealing the semiconductor laser elements.

12. The light-emitting device according to claim 1, wherein the semiconductor laser elements further include a plurality of second color-light-emitting laser elements that emit light having a color different from red, among the first type to the R-th type of semiconductor laser elements, a type with a larger ordinal number has a shorter emission peak wavelength, the second color-light-emitting laser elements include first to V-th types of semiconductor laser elements (where V is a natural number and 2≤V≤(R−1)), and among the first type to the V-th type of semiconductor laser elements, a type with a larger ordinal number has a shorter emission peak wavelength.

13. The light-emitting device according to claim 12, wherein the second color-light-emitting laser elements emit green light.

14. A light-emitting device comprising:

a plurality of semiconductor laser elements including a plurality of first color-light-emitting laser elements that emit green light, the first color-light-emitting laser elements including first to R-th types of semiconductor laser elements (where R is a natural number and R≥3) arrayed in a matrix of M rows and N columns (where M is a natural number and M≥2, and N is a natural number and N≥3), wherein the first color-light-emitting laser elements include two or more first semiconductor laser elements, as the first type of semiconductor laser elements, each having an emission peak wavelength in a range of greater than 527 nm and smaller than 532 nm, two or more second semiconductor laser elements, as the second type of semiconductor laser elements, each having an emission peak wavelength in a range of greater than 523 nm and smaller than 527 nm, and two or more third semiconductor laser elements, as the third type of semiconductor laser elements, each having an emission peak wavelength in a range of greater than 518 nm and smaller than 523 nm, and in the M rows and the N columns, in whole or in part, the plurality of first color-light-emitting laser elements are disposed so that in a row direction, a semiconductor laser element other than the two or more first semiconductor laser elements is adjacent to any one of the two or more first semiconductor laser elements, a semiconductor laser element other than the two or more second semiconductor laser elements is adjacent to any one of the two or more second semiconductor laser elements, and a semiconductor laser element other than the two or more third semiconductor laser elements is adjacent to any one of the two or more third semiconductor laser elements, in the row direction,

any one of the two or more first semiconductor laser elements is not adjacent to any one of the two or more first semiconductor laser elements, any one of the two or more second semiconductor laser elements is not adjacent to any one of the two or more second semiconductor laser element, and any one of the two or more third semiconductor laser elements is not adjacent to any one of the two or more third semiconductor laser elements, and a plurality of the semiconductor laser elements arranged in the same row are electrically connected in series, and a value obtained by dividing N by R is not an integer.

15. A light-emitting device comprising:

a plurality of semiconductor laser elements including a plurality of first color-light-emitting laser elements that emit green light, the first color-light-emitting laser elements including first to R-th types of semiconductor laser elements (where R is a natural number and R≥3) arrayed in a matrix of M rows and N columns (where M is a natural number and M≥2, and N is a natural number and N≥3), wherein the first color-light-emitting laser element includes two or more first semiconductor laser elements, as the first type of semiconductor laser elements, each having an emission peak wavelength in a range of greater than 534 nm and smaller than 539 nm, two or more second semiconductor laser elements, as the second type of semiconductor laser elements, each having an emission peak wavelength in a range of greater than 530 nm and smaller than 534 nm, and two or more third semiconductor laser elements, as the third type of semiconductor laser elements, each having an emission peak wavelength in a range of greater than 525 nm and smaller than 530 nm, and in the M rows and the N columns, in whole or in part, the plurality of first color-light-emitting laser element are disposed so that in a row direction, a semiconductor laser element other than the two or more first semiconductor laser elements is adjacent to any one of the two or more first semiconductor laser elements, a semiconductor laser element other than the two or more second semiconductor laser elements is adjacent to any one of the two or more second semiconductor laser elements, and a semiconductor laser element other than the two or more third semiconductor laser elements is adjacent to any one of the two or more third semiconductor laser elements, in the row direction, any one of the two or more first semiconductor laser elements is not adjacent to any one of the two or more first semiconductor laser elements, any one of the two or more second semiconductor laser elements is not adjacent to any one of the two or more second semiconductor laser element, and any one of the two or more third semiconductor laser elements is not adjacent to any one of the two or more third semiconductor laser elements, a plurality of the semiconductor laser elements arranged in the same row are electrically connected in series, and a value obtained by dividing N by R is not an integer.

* * * * *